(12) United States Patent
Kikuta et al.

(10) Patent No.: US 7,663,207 B2
(45) Date of Patent: Feb. 16, 2010

(54) SEMICONDUCTOR DEVICE

(75) Inventors: Kuniko Kikuta, Kawasaki (JP); Masayuki Furumiya, Kawasaki (JP); Ryota Yamamoto, Kawasaki (JP); Makoto Nakayama, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 481 days.

(21) Appl. No.: 11/407,323

(22) Filed: Apr. 20, 2006

(65) Prior Publication Data

US 2006/0237819 A1   Oct. 26, 2006

(30) Foreign Application Priority Data

Apr. 21, 2005   (JP) ............... 2005-123462

(51) Int. Cl.
*H01L 29/00* (2006.01)
(52) U.S. Cl. ............... 257/532; 257/E29.343; 257/E23.144
(58) Field of Classification Search ............... 257/532, 257/E51.003, E27.024, E27.025, E27.048, 257/E29.343, 535, E21.008, E21.018–E21.02, 257/E23.144; 349/51
See application file for complete search history.

(56) References Cited

U.S. PATENT DOCUMENTS

2002/0047154 A1   4/2002 Sowlati et al.
2003/0089937 A1*  5/2003 Yamauchi et al. ........... 257/296
2004/0152258 A1*  8/2004 Kiyotoshi ................... 438/253
2005/0145987 A1*  7/2005 Okuda et al. ................ 257/532

FOREIGN PATENT DOCUMENTS

JP   05-090489   4/1993
JP   2001-196372   7/2001

* cited by examiner

*Primary Examiner*—Sue Purvis
*Assistant Examiner*—Leslie Pilar Cruz
(74) *Attorney, Agent, or Firm*—Young & Thompson

(57) ABSTRACT

A semiconductor device includes a capacitor with an MIM structure, by which the dimensional accuracy of the device is improved, and a stable capacitance value is given. The semiconductor device 100 includes: a semiconductor substrate 102; a capacitor forming region 130 in which an MIM capacitor is formed, which has an insulating interlayer 104 formed on the semiconductor substrate 102, a first electrode 110, and a second electrode 112, and the first electrode 110 and the second electrode 112 are arranged facing each other through the insulating interlayer 104; and a shielding region 132 which includes a plurality of shielding electrodes 114 formed in the outer edge of the capacitor forming region 130 and, at the same time, set at a predetermined potential in the same layer as that of the MIM capacitor on the semiconductor substrate 102, and shields the capacitor forming region 130 from other regions.

20 Claims, 22 Drawing Sheets

SEMICONDUCTOR DEVICE

This application is based on Japanese Patent application NO. 2005-123462, the content of which is incorporated hereinto by reference.

BACKGROUND

1. Technical Field

The present invention relates to a semiconductor device including a capacitor with a metal-insulator-metal (MIM) structure.

2. Related Art

Recently, an MIM capacitor, in which a parasitic resistance and parasitic capacitance are remarkably small in comparison with a conventional metal oxide semiconductor (MOS) capacitor, has been used more often for a capacitor element. Moreover, a one-chip structure in which such MIM capacitors are built into a logic device has been developed, too. In order to achieve the above structure, the structures and the manufacturing processes for both of the logic device and the capacitor device have been required to be integrated. A common logic device includes a multilayer structure in which interconnections are stacked to form a multi-layered structure. It is an important technical project to apply the structure and the process for the MIM capacitor to the above multi-layered interconnection structure. Considering the above circumstances, a process, according to which an electrode of the MIM capacitor is manufactured in a similar technique to that of the multilayer interconnection structure in a device region, has been developed.

U.S. Laid-open patent application publication No. 2002/0047154 has disclosed a multilayer capacitor-structure in which a first level layer, a second layer, and an insulating film are included, wherein conductive lines are arranged in parallel to one another in the first level layer, conductive lines provided facing the conductive lines in the first level layer are arranged in parallel to one another in the second level layer, and the insulating film formed between the first and second layers.

However, when there are variations in an interconnection pattern at forming the multilayer interconnection structure, there is caused a problem that a flattened layer is not realized, and the dimensional accuracy is deteriorated. In order to solve the above problem, there is used a technique according to which the uniformity of the interconnection density of an interconnection layer is improved by arranging a dummy interconnection in an interconnection layer related with a circuit function of an integrated circuit formed in a semiconductor device. Japanese Laid-open patent publication NO. 2001-196372 has disclosed a technique according to which the above dummy interconnection is not set to be electrically floating, but is fixed at the ground potential.

Incidentally, a capacitor element has had a problem that the finer semiconductor device causes other interconnections formed in a surrounding region of the capacitor to have the influence on the device, and a capacitance value of the capacitor to become unstable. Japanese Laid-open patent publication NO. H5-90489 has disclosed a configuration in which, in a semiconductor integrated circuit provided with a capacitor element in which a lower electrode is formed on a semiconductor substrate, and an upper electrode with a polygonal shape is formed thereabove, shields formed of the same material as that of the upper electrode are arranged, respectively, at positions which are opposed to and apart from each side of the polygonal upper electrode. Thereby, a capacitor with high resistance to disturbances, small additional capacitance, and high accuracy is formed even under the finer structure, according to Japanese Laid-open patent publication NO. H5-90489.

However, the configuration of the semiconductor integrated circuit described in Japanese Laid-open patent publication NO. H5-90489 has a problem that a shielding effect against a leakage electric field to the lower electrode is small, as the shields are arranged, respectively, at positions which are opposed to and apart from each side of the polygonal upper electrode. Moreover, there is also a problem that dimensional accuracy at forming the lower electrode may not be improved.

SUMMARY OF THE INVENTION

According to the present invention, there is provided a semiconductor device, including: a semiconductor substrate; a capacitor forming region in which an MIM capacitor is formed, the MIM capacitor including an insulating film formed on the semiconductor substrate, a first electrode, and a second electrode, the first electrode and the second electrode being arranged facing each other with the insulating film interposed therebetween; and a shielding region which is formed at the outer edge of the capacitor forming region to surround the capacitor forming region for shielding the capacitor forming region from other regions, the shielding region including a plurality of shielding electrodes formed on the semiconductor substrate in the entire layer(s) in which the first electrode and the second electrode of the MIM capacitor are formed to surround the first electrode and the second electrode, each of the plurality of shielding electrodes being set at a predetermined potential.

Here, when the first electrode and the second electrode are formed, the shielding electrode may be simultaneously formed as the dummy pattern. Thereby, the dimensional accuracy of the semiconductor device may be improved. Moreover, the capacitance value of the MIM capacitor may be stabilized because the shielding electrode is formed in the outer edge of the layer in which the first electrode and the second electrode are formed, and the capacitor forming region may be shielded from other regions.

Here, the MIM capacitor may be assumed to be a parallel-plate MIM capacitor with a configuration in which one of the first electrode and the second electrode is formed in a layer between interconnection layers, and the other is formed in the one of the interconnection layers as an usual interconnection metal, and the insulating film is formed therebetween. Moreover, the MIM capacitor may be also assumed to be an interconnection MIM capacitor with a configuration in which the first electrode and the second electrode are formed like a comb in an alternating way in the same layer as an interconnection metal, and the insulating film is formed therebetween. A shielding electrode may be obtained by forming at least one dummy electrode in each direction in such a way that the dummy electrodes enclose around the MIM capacitor, and setting the potential of the dummy electrode at a predetermined voltage.

In the semiconductor device of the present invention, at least one of said shielding electrodes may be set a potential between a voltage set for said first electrode and a voltage set for said second electrode.

According to the present invention, the dimensional accuracy of a semiconductor device is improved, and a stable capacitance value is given in the semiconductor device including a capacitor with an MIM structure.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
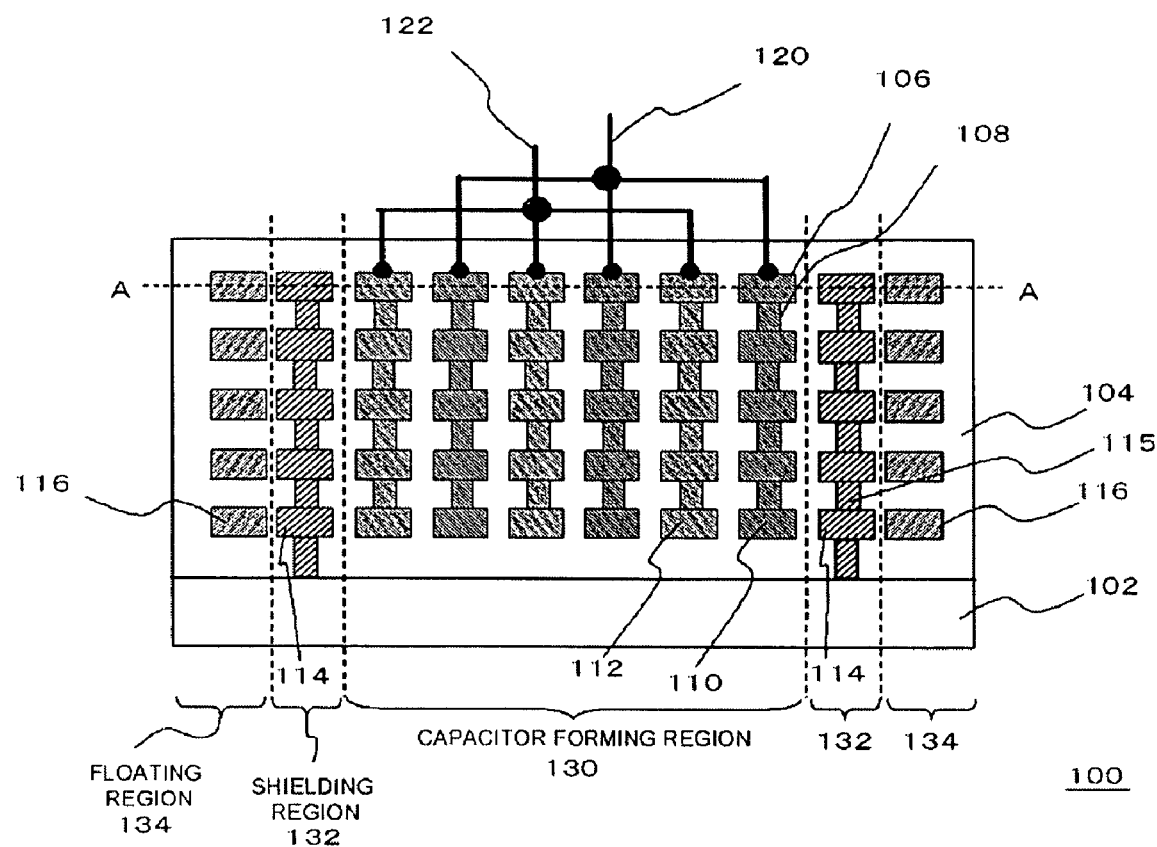
FIG. 1 is a cross-sectional view showing a configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be explained, referring to drawings. Here, components similar to those all in the drawings are denoted by the same reference numerals, and description will not be repeated.

First Embodiment

FIG. 1 is a cross-sectional view showing a configuration of a semiconductor device 100 according to an embodiment.

The semiconductor device 100 includes a semiconductor substrate 102, a capacitor forming region 130 in which an MIM capacitor is formed, and a shielding region 132 for shielding the capacitor forming region 130 from other regions.

The MIM capacitor includes an insulating interlayer 104 (insulating film) formed on the semiconductor substrate 102, a first electrode 110, and a second electrode 112. The first electrode 110 and the second electrode 112 are arranged facing each other through the insulating film 104.

The shielding region 132 includes a plurality of shielding electrodes 114 formed on the semiconductor substrate 102 in the outer edge of the capacitor forming region 130 to surround the capacitor forming region 130. The shielding electrodes 114 are formed in the same layer as that of the MIM capacitor. In this embodiment, the shielding electrodes 114 are formed in the entire layers in which the first electrode 110 and the second electrode 112 of the MIM capacitor are formed. Each of the plurality of shielding electrodes 114 are set at a predetermined potential.

The semiconductor device 100 has the multilayer interconnection structure in which a plurality of interconnections 106 and a plurality of vias 108 formed on and under the interconnection 106 are stacked. The interconnections 106 serve as the first electrode 110 and the second electrode 112. Here, though the insulating interlayer 104 is shown as a single structure, the insulating interlayer 104 includes a plurality of stacked layers including etching stopper layers, insulating interlayers, and protective insulating layers. The insulating interlayer 104 may be formed of the same materials as those of an insulating interlayer used in the logic region with a multilayer interconnection structure. The insulating interlayer 104 may be formed of, for example, a silicon oxide film or a low dielectric constant film.

In the present embodiment, the interconnections 106 at the upper layer and the lower layer are electrically connected to each other through the via 108. The interconnection 106 may be formed of copper or aluminum. The interconnection 106 includes the first electrode 110 connected to a first potential line 120, and the second electrode 112 connected to a second potential line 122 set at a potential different from that of the first potential line 120. In the present embodiment, the insulating interlayer 104 functions as a capacitor film. The first electrode 110, the insulating interlayer 104, and the second electrode 112 are arranged parallel to one another in the same layer to form an MIM capacitor. Moreover, in each layer of the semiconductor device 100, the first electrode 110 and the second electrode 112 are arranged through the insulating interlayer 104, parallel to each other, in an alternating way. Furthermore, in the present embodiment, capacitance may be also caused in the portion of the via 108 to make the capacitance value of the MIM capacitor larger, because connection to the interconnection 106 is made through the via 108, and the via 108 is also kept at the same potential as that of the interconnection 106 connected to the via 108.

The semiconductor device 100 includes the capacitor forming region 130 in which a capacitor is formed, the shielding region 132 formed around the capacitor forming region 130, and a floating region 134 formed around the shielding region 132.

Here, the capacitor forming region 130 includes a plurality of the first electrodes 110 and a plurality of the second electrodes 112, wherein the both electrodes are formed in a plurality of the interconnection layers. The shielding region 132 includes a plurality of shielding electrodes 114, each of which is formed in the outer edge of the plurality of the first electrodes 110 and the plurality of the second electrodes 112 in each of the interconnection layers in which a plurality of the first electrodes 110 and a plurality of the second electrodes 112 are formed, and a plurality of shielding vias 115 connecting a plurality of shielding electrodes 114 formed in a plurality of the interconnection layers. The shielding electrodes 114 at the upper layer and the lower layer are electrically connected to each other through the shielding via 115. In the present embodiment, the shielding electrodes 114 are electrically connected to the semiconductor substrate 102 through the shielding vias 115 and are grounded.

In the present embodiment, though not shown, the semiconductor device 100 may include a logic region having a transistor formed in a region different from a capacitor forming region 130 on the semiconductor substrate 102, and a multilayer interconnection structure formed on the transistor.

Interconnections and vias formed in the capacitor forming region 130, the shielding region 132, and the floating region 134 and the like may be simultaneously formed at the same process with interconnections and vias in the multilayer interconnection structure of the logic region.

In the present embodiment, the shielding electrode 114 and the floating electrode 116 are simultaneously formed as the dummy pattern when the first electrode 110 and the second electrode 112 are formed. That is, the shielding electrode 114 and the floating electrode 116 are formed in the whole layer in which the first electrode 110 and the second electrode 112 are formed. The shielding electrode 114 and the floating electrode 116 is provided, regardless of the circuit operation of the semiconductor device 100, in order to improve the dimensional accuracy of other components related with circuit operations of the semiconductor device 100. In the present embodiment, a part of the above dummy pattern is used as a shielding electrode 114 which cuts off the capacitor forming region 130, in which the first electrode 110 and the second electrode 112 are formed, from other regions. Moreover, the remaining dummy pattern is used as the floating electrode 116. Even when the set potential of the interconnection arranged at the outermost portion in other regions is different from that of the shielding electrode 114, the difference between the both potentials is lessened with the floating electrode 116 by providing the floating region 134 including the floating electrode 116 between the shielding region 132 and other regions out of them, and a capacity component generated between these interconnections is controlled to be lower.

Figure 2:
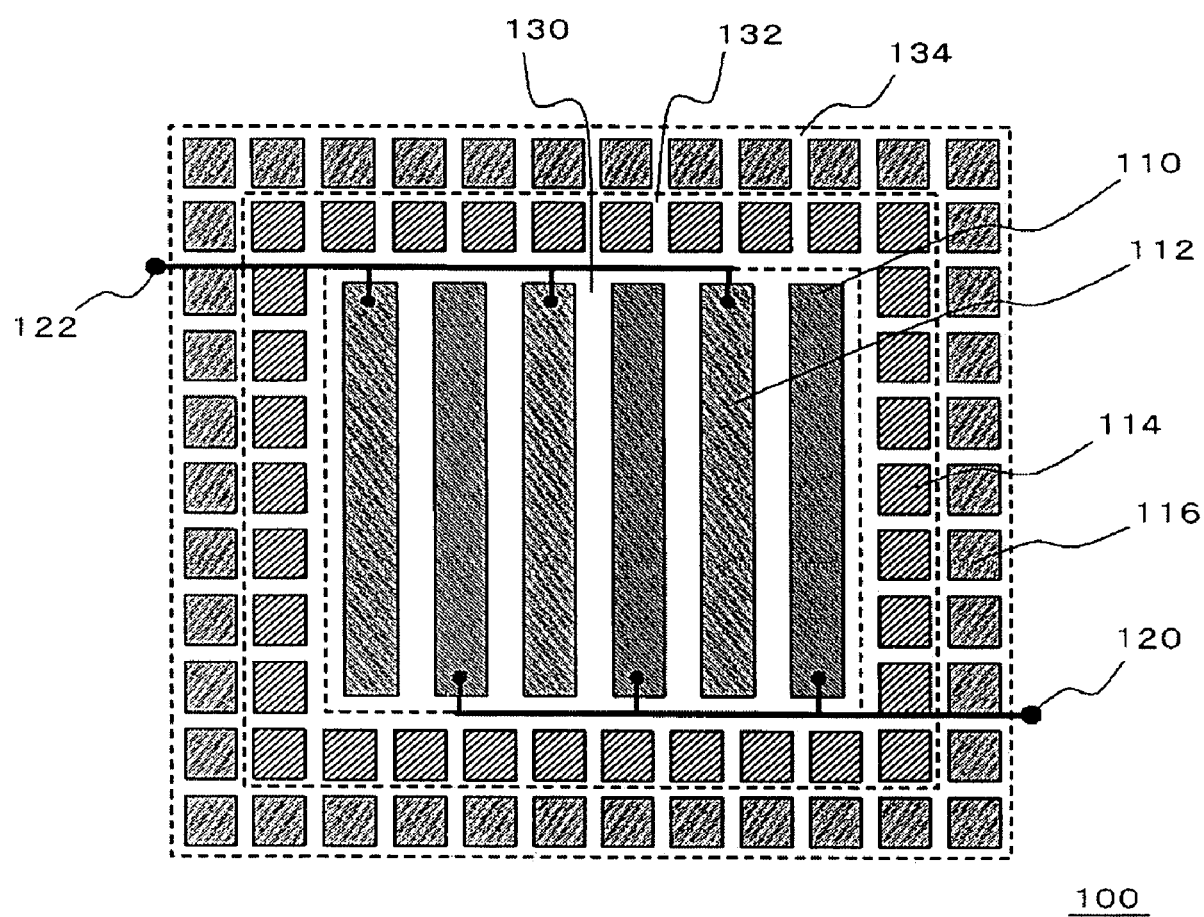
FIG. 2 is a cross-sectional plan view taken along the A-A line of the semiconductor device shown in FIG. 1.

FIG. 2 is a cross-sectional plan view taken along the A-A line of the semiconductor device 100 shown in FIG. 1.

In the present embodiment, the first electrode 110 and the second electrode 112 have an interconnection shape in which the electrodes are extending in one direction. The capacitor forming region 130 may be of a polygonal shape in the plan view or two-dimensional arrangement, and a plurality of the shielding electrodes 114 are arranged along each side of the capacitor forming region 130. In the present embodiment, the capacitor forming region 130 has a rectangular shape in the plan view, and a plurality of the shielding electrodes 114 are arranged around four sides of the capacitor forming region 130. Here, the shielding electrode 114 has a dot-like shape in the plan view, and a plurality of the shielding electrodes 114 are arranged to be distributed in the shielding region 132. The floating electrode 116 has the same shape in the plan view as that of the shielding electrode 114. In the present embodiment, the floating electrode 116 also has a dot-like shape in the plan view. A plurality of the floating electrodes 116 are arranged at four sides of the shielding region 132. The plurality of floating electrodes 116 are arranged to be distributed in the floating region 134. Thus, according to the configuration in which the shielding electrode 114 and the floating electrode 116 have the dot-like shape in the plan view, the shielding electrode 114 and the floating electrode 116 may more effectively function as a dummy pattern to improve the dimensional accuracy of the interconnection 106 (the first electrode 110 and the second electrode 112) in the capacitor forming region 130.

Moreover, according to the configuration in which the dot-like shape in the plan view is applied as the arranged pattern of the shielding electrodes 114 and the floating electrodes 116, the shielding electrodes 114 and the floating electrodes 116 may be appropriately distributed and arranged regardless of the arranged pattern of the first electrodes 110 and the second electrodes 112. Even under the above configuration, the shielding function may be secured because the shielding electrodes 114 in the upper layers and the lower one are connected to each other through the shielding vias 115 shown in FIG. 1.

Moreover, the first potential line 120 and the second potential line 122 are formed in at least one layer among a plurality of layers of the semiconductor device 100. As described above, the interconnections 106 in the upper layers and the lower ones in the semiconductor device 100 are electrically connected to each other through the vias 108. Thereby, the first electrodes 110 and the second electrodes 112 in all the layers may be set at a desired constant potential, respectively, by connecting the first electrodes 110 to the first potential line 120, and the second electrodes 112 to the second potential line 122 in at least one layer among a plurality of layers in the semiconductor device 100.

In the semiconductor device 100 according to the present embodiment, the interconnections and the vias formed in the capacitor forming region 130, the shielding region 132, and the floating region 134 may be formed by the same method and at the same process as those of the interconnections and the vias, which are formed in the logic region, of the multilayer interconnection structure.

In the present embodiment, the dimensional accuracy of the semiconductor device 100 may be improved because the shielding region 132 and the floating region 134 are formed in the outer edge of the capacitor forming region 130. Moreover, since the shielding electrodes 114 in the upper layers and the lower layers are connected with each other through the shielding vias 115, these shielding electrodes 114 are set at the same potential, capacitance generation between the shielding electrodes 114 can be prevented.

Figure 3:
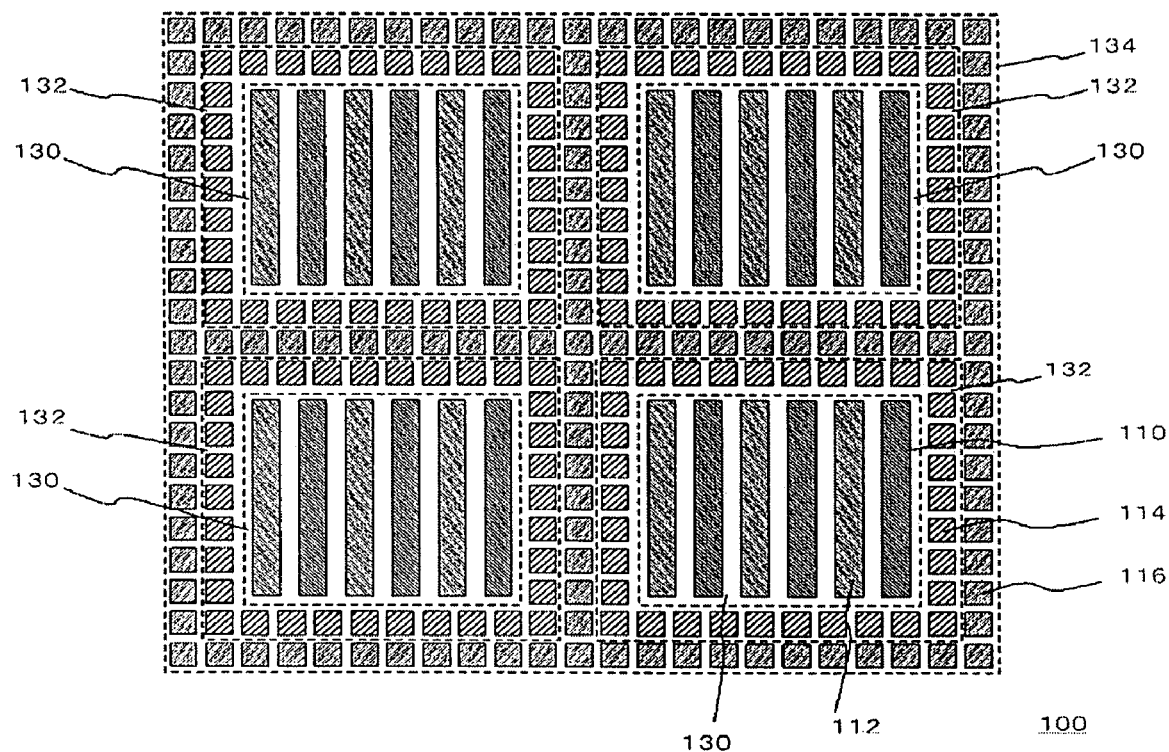
FIG. 3 is a cross-sectional plan view showing a configuration in which a plurality of capacitor forming regions are formed.

FIG. 3 is a cross-sectional plan view showing a configuration in which a plurality of the capacitor forming regions 130 are formed.

Here, four capacitor forming regions 130 are formed on the semiconductor substrate (not shown), and the shielding region 132 is formed around each capacitor forming region 130. Moreover, the floating region 134 is formed between the shielding regions 132. According to the above configuration, for example, a shielding region 132 formed around one capacitor forming region 130 functions as a shield which cuts off the capacitor forming region 130 from other regions. In addition, the shielding region 132 also functions as a dummy pattern which improves the dimensional accuracy of interconnections 106 when the interconnections 106 are formed in the above capacitor forming region 130 and other capacitor forming regions 130. Thereby, the dimensional accuracy of the semiconductor device 100 may be further improved.

Figure 4:
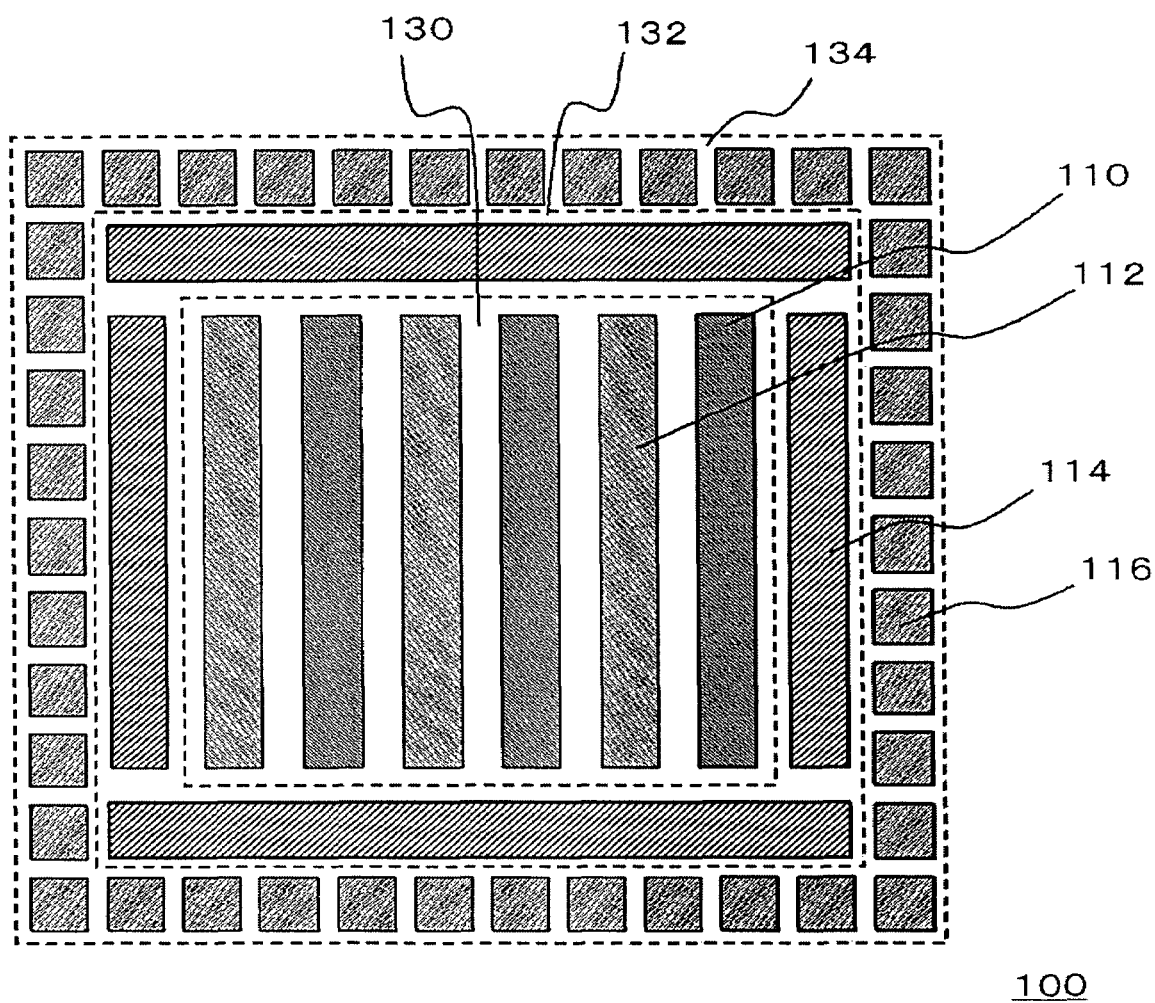
FIG. 4 is a view showing another example of the cross-sectional plan view taken along the A-A line of the semiconductor device shown in FIG. 1.

FIG. 4 is a view showing another example of the cross-sectional plan view taken along the A-A line of the semiconductor device 100 shown in FIG. 1.

The shielding electrode 114 may be also configured to have the interconnection shape as that of the first and the second electrodes 110 and 112, wherein, according to the interconnection shape, the electrodes are extending in one direction. Even under the above configuration, as the shielding electrodes 114 are formed at the first electrode 110 and the second electrode 112 formed at the edge of the capacitor forming region 130 a pattern in which the first electrodes 110 and the second electrodes 112 are repeatedly arranged can be maintained with the shielding electrode 114, thus the dimensional accuracy of the semiconductor device 100 may be improved. Moreover, the shielding function may be improved by the above configuration.

The shielding electrode 114 may be configured to have the same shape as that of the first electrode 110 or the second electrode 112, or a shape smaller than that of the first electrode 110, or the second electrode 112. Thereby, the function of the shielding electrode 114 may be improved as the dummy pattern when the first electrode 110 and the second electrode 112 are formed. However, some of the shielding electrodes 114 may be configured to have a shape larger than that of the first electrode 110 or the second electrode 112.

Figure 5:
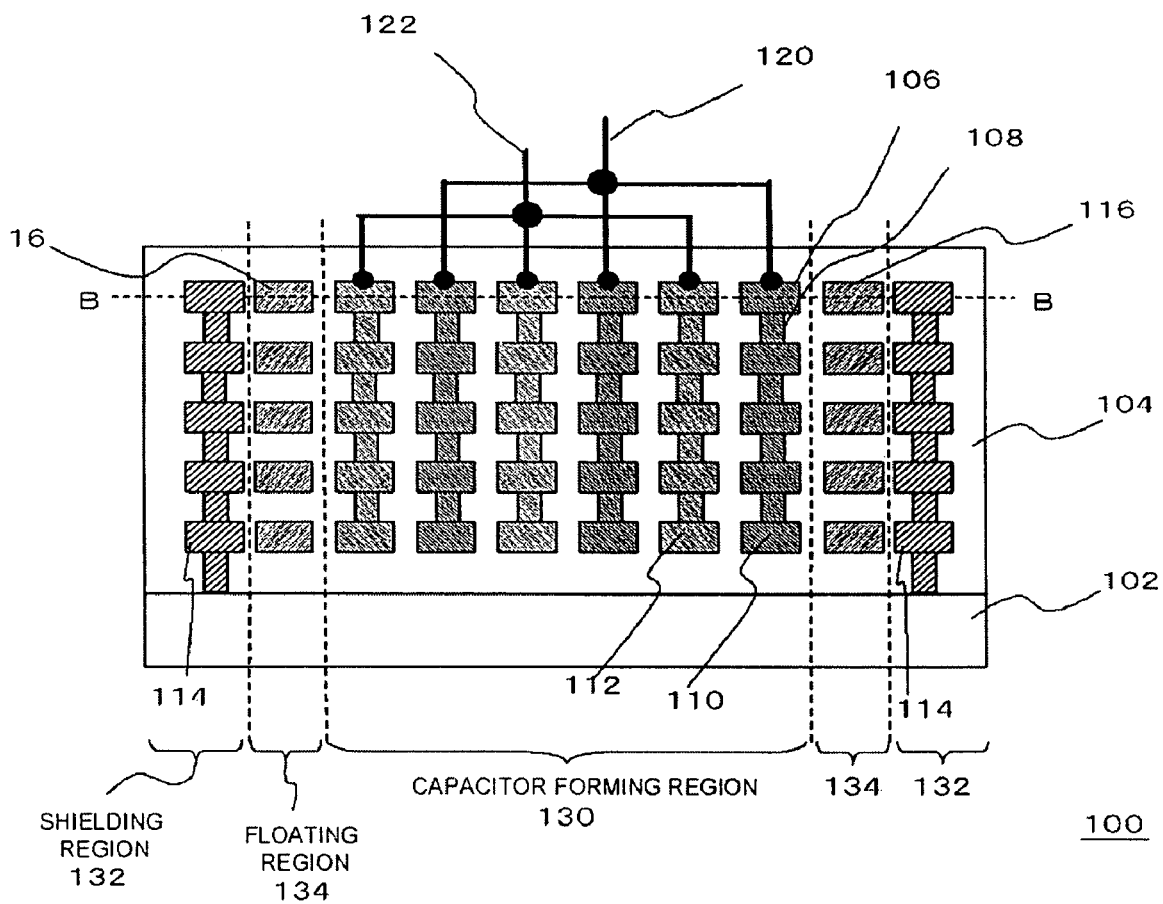
FIG. 5 is a cross-sectional view showing another example of the semiconductor device according to the embodiment of the present invention.

FIG. 5 is a cross-sectional view showing another example of the semiconductor device 100 according to the present embodiment.

FIG. 5 differs from the examples shown in FIG. 1 through FIG. 3 in a point that the floating region 134 is formed around the capacitor forming region 130 and the shielding region 132 is formed around the floating region 134.

In the present embodiment, the first electrodes 110 and the second electrodes 112 are arranged in an alternating way, the first electrode 110 is arranged at one end of the capacitor forming region 130, and the second electrode 112 is arranged at the other end of the capacitor forming region 130. The first electrode 110 and the second electrode 112 form a capacitor, one of the two is grounded, and the other of the two is set at a high potential. In the present embodiment, when the shielding electrode 114 is arranged in the vicinity of the first electrode 110 or the second electrode 112 which is set at the high potential, there is a possibility that capacitance might be generated between the shielding electrode and the first or second electrode 110 or 112 set at the high potential, because the shielding electrode 114 is connected to the semiconductor substrate 102 and is grounded. In the example shown in FIG. 5, because the floating region 134 is provided between the capacitor forming region 130 and the shielding region 132, the first or second electrode 110 or 112 set at the high potential can be placed apart from the shielding electrode 114 to have a certain intervals therebetween, and capacitance generation can be prevented.

Figure 6:
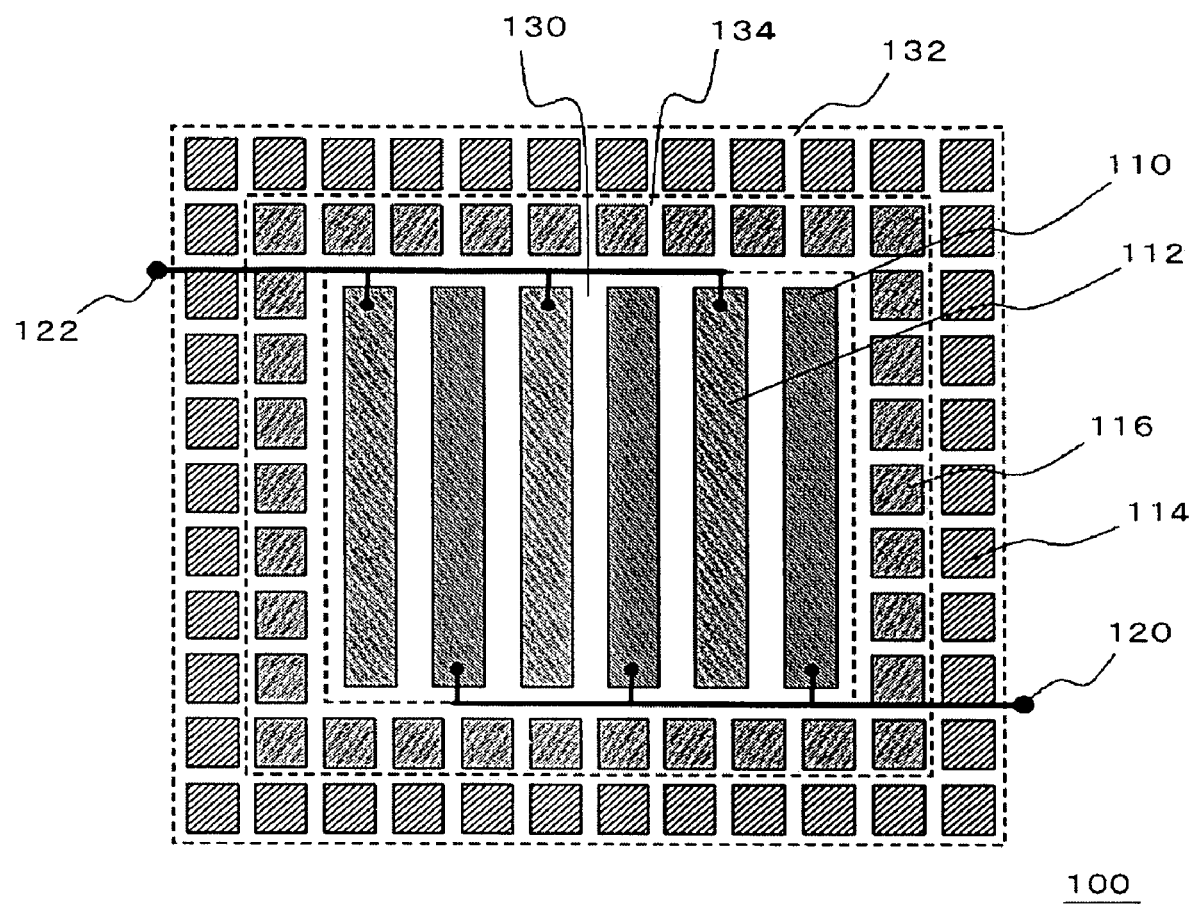
FIG. 6 is a cross-sectional plan view taken along the B-B line of the semiconductor device shown in FIG. 5.

FIG. 6 is a cross-sectional plan view taken along the B-B line of the semiconductor device 100 shown in FIG. 5.

As for the structure shown in FIG. 6, the floating electrodes 116 and the shielding electrodes 114, which have a dot-like shape in the plan view, are arranged to be distributed and around the capacitor forming region 130 in a similar manner to that of FIG. 2. Thereby, the dimensional accuracy of the interconnections 106 may be improved when the interconnection 106 and the like are formed.

Figure 7:
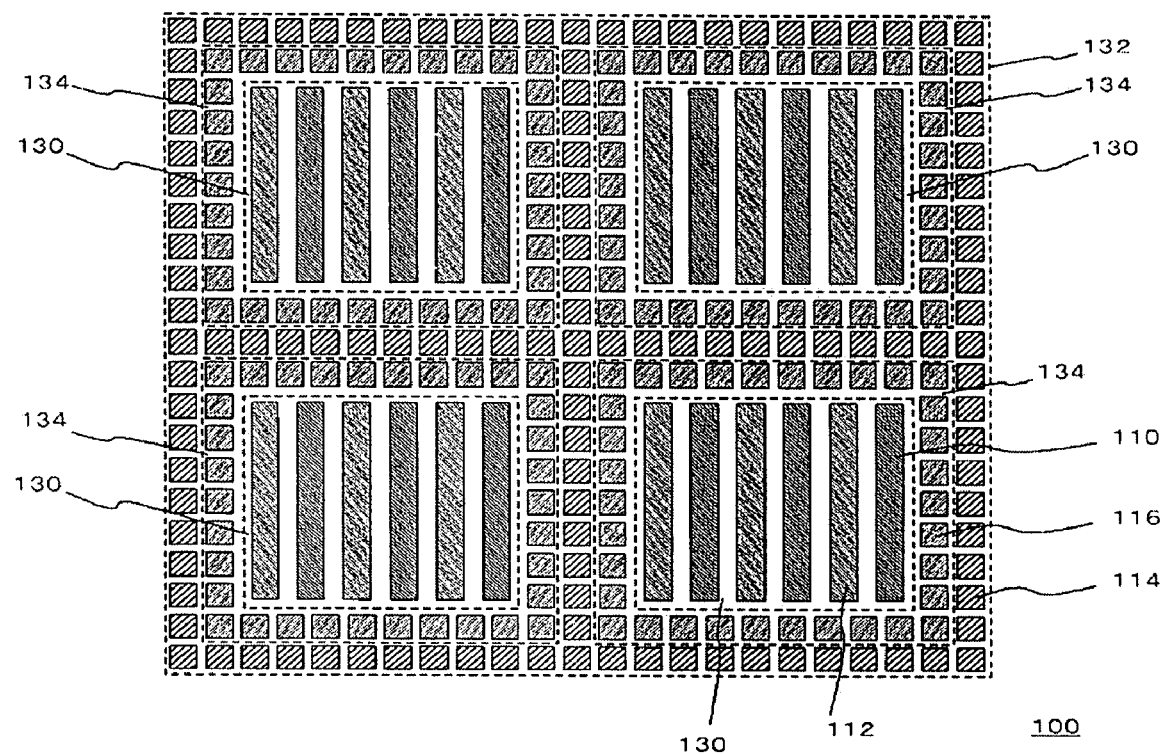
FIG. 7 is a cross-sectional plan view showing a configuration in which a plurality of capacitor forming regions are formed.

FIG. 7 is a view showing a configuration in which a plurality of the capacitor forming regions 130 are formed.

Here, four capacitor forming regions 130 are formed on the semiconductor substrate (not shown), and the floating region 134 is formed around each of the capacitor forming regions 130. Moreover, the shielding region 132 is formed in such a way that the shielding region 132 surrounds, from the outside of the floating region 134, the capacitor forming region 130 surrounded by the floating region 134. Here, the shielding region 132 is provided in such a way that adjacent capacitor forming regions 130 share each side of the shielding region 132. As described above, since the present example has a configuration in which the floating region 134 is formed between the capacitor forming region 130 and the shielding region 132 to put some distance between the capacitor forming region 130 and the shielding region 132, capacitance generation between the electrodes can be prevented even under a state in which there is a difference in the potential between the shielding electrode 114 and the first electrode 110 or the second electrode 112. Accordingly, even according to the configuration in which a plurality of the capacitor forming regions 130 share the shielding region 132, each of the capacitor forming regions 130 may be effectively cut off from other regions with the shielding region 132.

Figure 8:
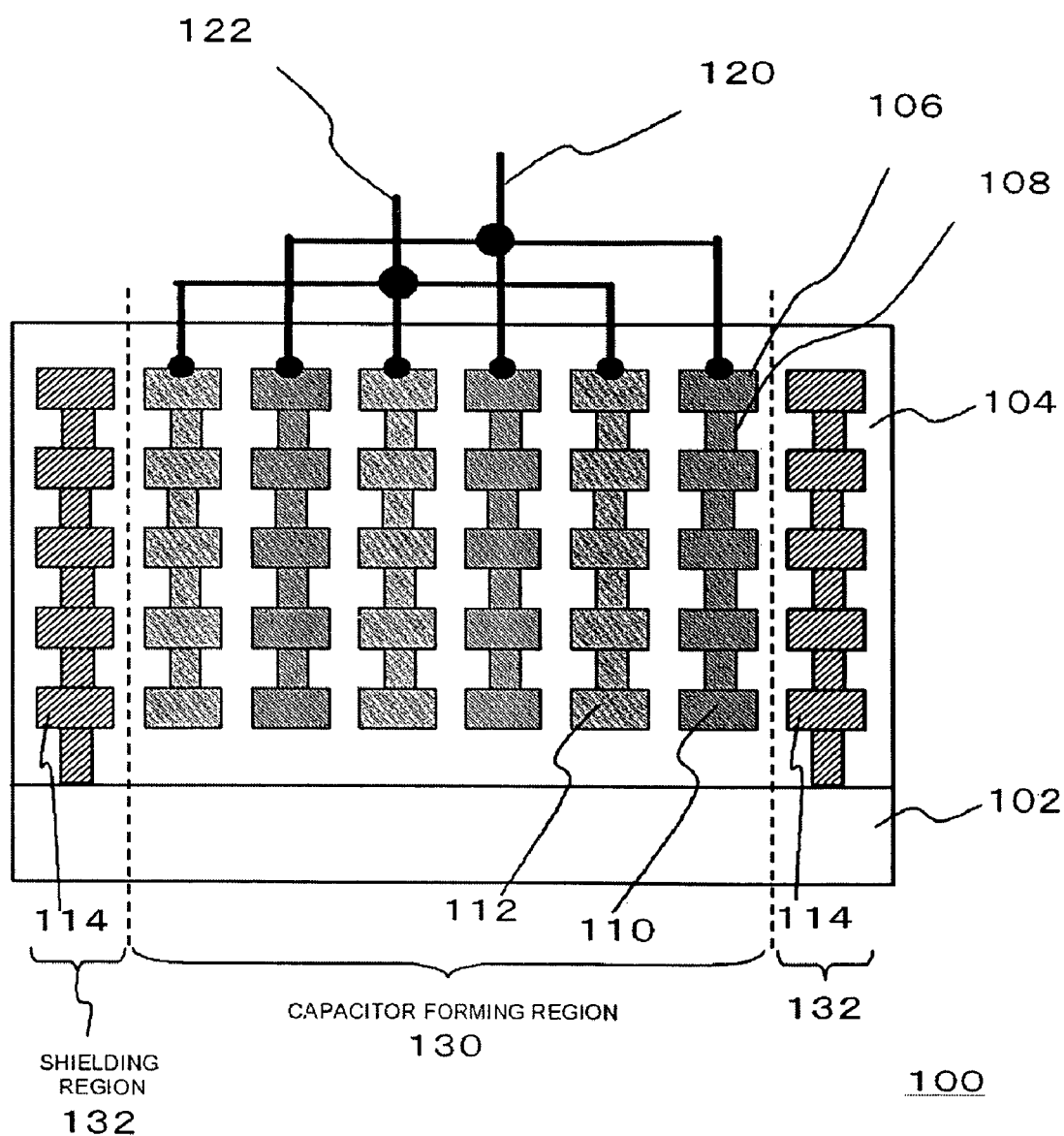
FIG. 8 is a cross-sectional view showing another example of a semiconductor device according to the embodiment of the present invention.

FIG. 8 is a cross-sectional view showing another example of the semiconductor device 100 according to the present embodiment.

Though configurations in which the semiconductor device 100 has the floating region 134 has been described in the above-described examples, the semiconductor device 100 may be configured not to include the floating region 134. Even according to the above configuration, each of the capacitor forming regions 130 may be cut off from other regions by forming the shielding region 132 around the capacitor forming region 130.

Figure 9:
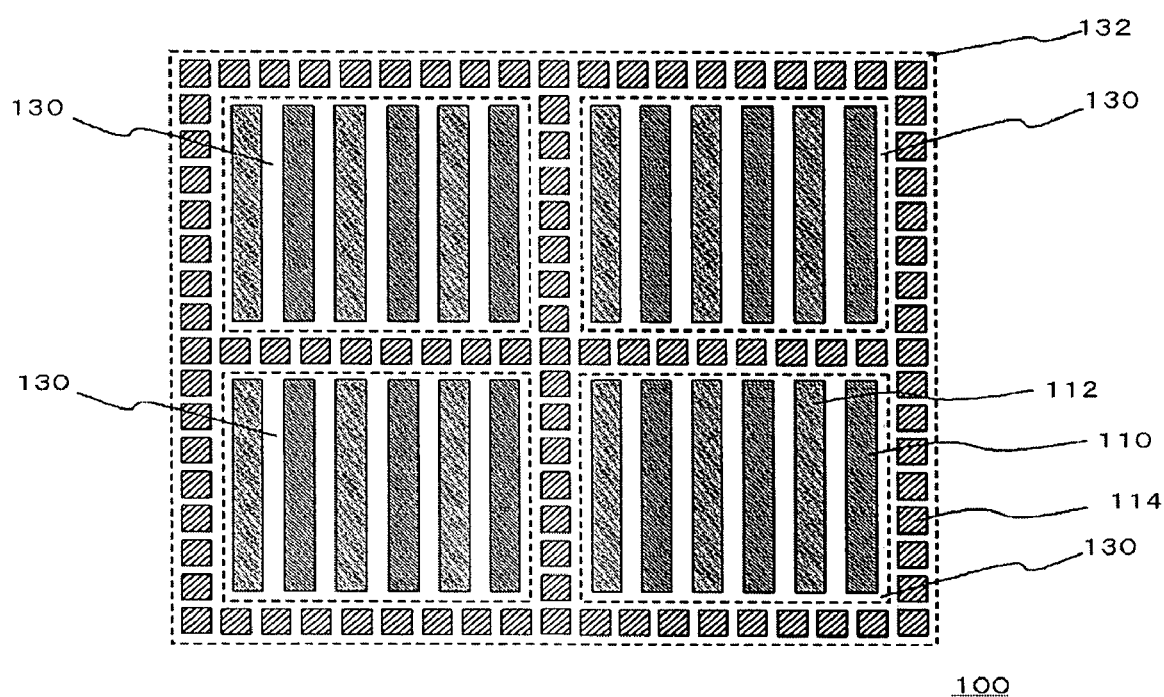
FIG. 9 is a cross-sectional plan view showing a configuration in which a plurality of the semiconductor devices with the configuration shown in FIG. 8 are formed.

FIG. 9 is a cross-sectional plan view showing a configuration in which a plurality of the semiconductor devices 100 with the configuration shown in FIG. 8 are formed.

In the drawing, four capacitor forming regions 130 are formed on the semiconductor substrate (not shown), and the shielding region 132 is formed around each of the capacitor forming regions 130. Here, a plurality of the capacitor forming regions 130 share the shielding electrode 114 formed in the shielding region 132. According to the above configuration, the dimensional accuracy of the semiconductor device 100 may be improved. Moreover, each of the capacitor forming regions 130 may be cut off from other regions.

Figure 10:
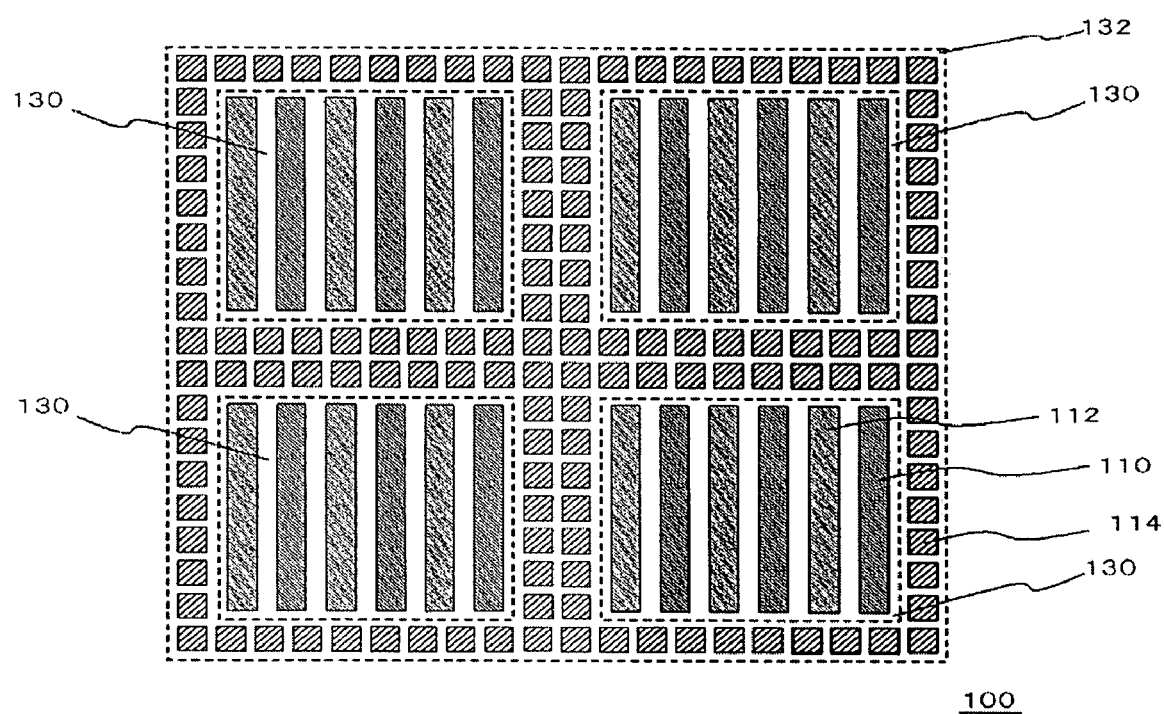
FIG. 10 is a cross-sectional plan view showing another example in which a plurality of the semiconductor devices with the configuration shown in FIG. 8 are formed.

FIG. 10 is a cross-sectional plan view showing another example in which a plurality of the semiconductor devices 100 with the configuration shown in FIG. 8 are formed.

Here, two shielding electrodes 114 are formed between the adjacent capacitor forming regions 130. According to the above configuration, the shielding electrode 114 may more effectively function as a dummy pattern to improve the dimensional accuracy of the semiconductor device 100. Moreover, the cutting-off function of the shielding region 132 may be also improved because all the shielding electrodes 114 in the shielding regions 132 formed around the plurality of the capacitor forming regions 130 are grounded and are set at the same potential.

Figure 11:
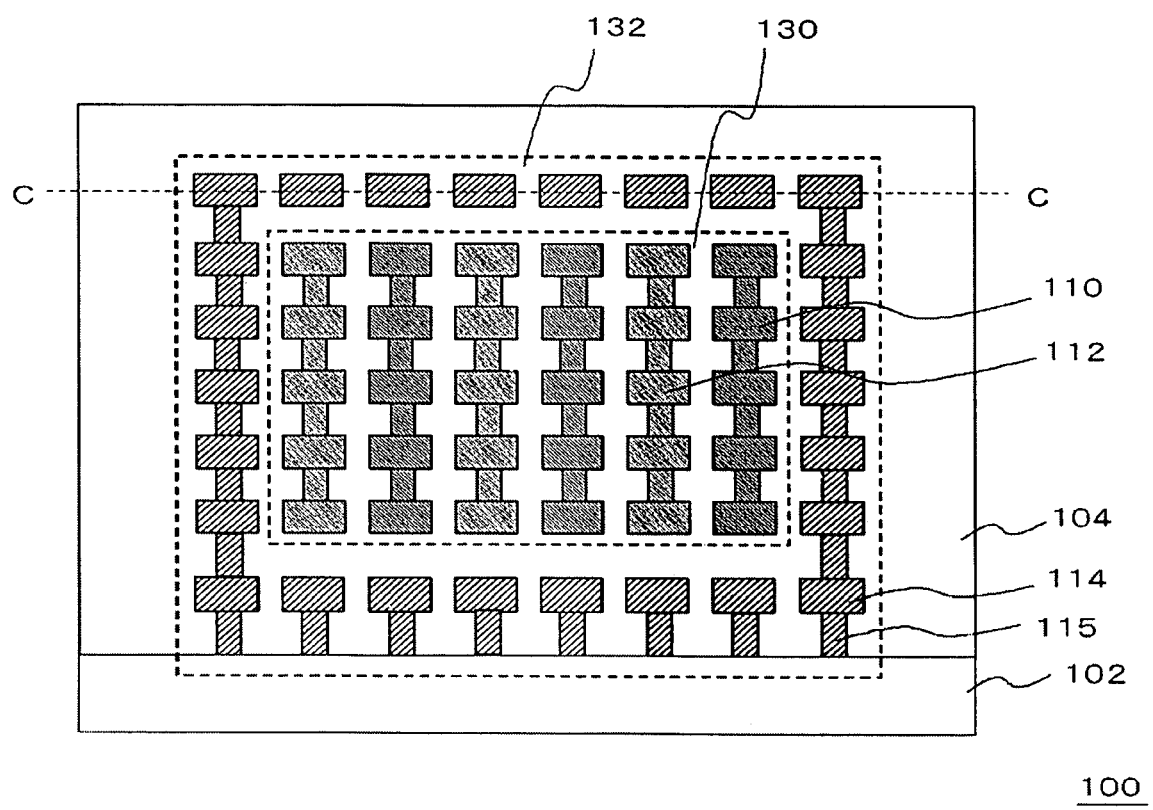
FIG. 11 is a cross-sectional view showing another example of a semiconductor device according to an embodiment of the present invention.

FIG. 11 is a cross-sectional view showing another example of the semiconductor device 100 according to the present embodiment.

In FIG. 11, the semiconductor device 100 further includes a plurality of shielding electrodes 114, which are formed in such a way that these electrodes 114 cover the upper portion or the lower portion of the MIM capacitors in the capacitor forming region 130. Thereby, the capacitor forming region 130 may be surrounded with the shielding region 132 not only in the outer edge in the planer direction, but also in the upper and lower layers, and the capacitor forming region 130 may be cut off from other regions in a further effective manner. Here, each of the shielding electrodes 114 formed in the lowermost layer is connected to the semiconductor substrate 102 through the shielding via 115 and is grounded.

Figure 12:
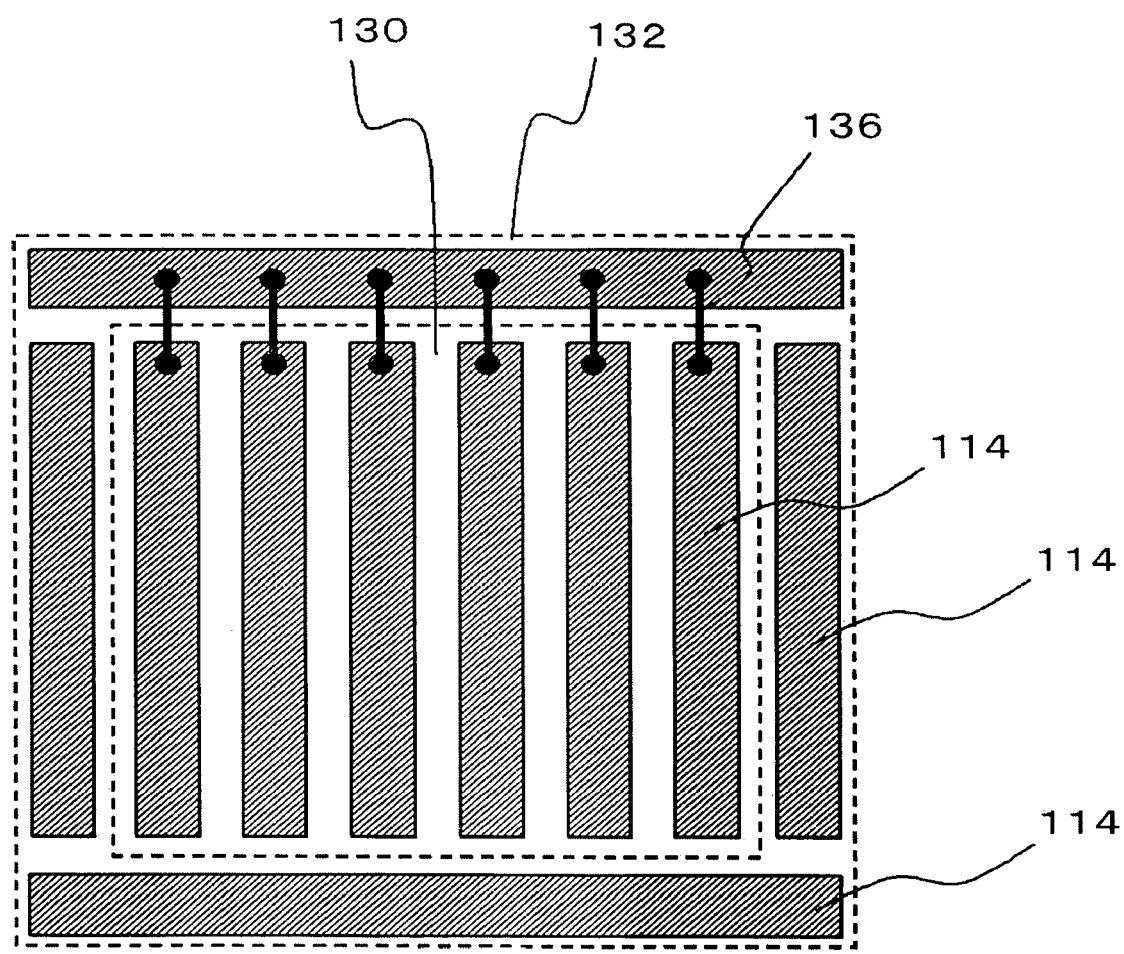
FIG. 12 is a cross-sectional plan view taken along the C-C line of the semiconductor device shown in FIG. 11.

FIG. 12 is a cross-sectional plan view taken along the C-C line of the semiconductor device 100 shown in FIG. 11.

As shown in the drawing, a plurality of the shielding electrodes 114 are connected with each other through connecting interconnections 136 where at least one of them is connected to the semiconductor substrate 102 through the shielding electrodes 114 in the lower layer and the shielding via 115 to be grounded such that all the shielding electrodes 114 can be grounded. Moreover, a plurality of the shielding electrodes 114 may be formed in a pattern directly connected with the shielding electrode 114 which is connected to the semiconductor substrate 102 provided that the flatness of the layer can be maintained.

As described above, the capacitor forming region 130 may be cut off from other regions in a more effective manner by forming the shielding regions 132 not only around the capacitor forming region 130 in the planer direction, but also in the upper and lower layers. Furthermore, the floating region 134 may be configured to be provided between the capacitor forming region 130 and the shielding region 132, or between the shielding region 132 and other regions also in this example.

As described above, the flatness of layers may be maintained, and the dimensional accuracy of the semiconductor device 100 may be improved according to the semiconductor device 100 of the present embodiment, because the shielding electrode 114 and the floating electrode 116 are simultaneously formed as a dummy pattern when the first electrode 110 and the second electrode 112 are formed, wherein the MIM capacitor is formed between the second electrode 112 and the first electrode 110. Moreover, the capacitor forming region 130 in which the MIM capacitor is formed may be shielded by the shielding electrodes 114 formed as described above, and the capacitance value of the MIM capacitor in the capacitor forming region 130 may be stabilized. Moreover, the capacitor forming region 130 may be shielded in a more effective manner according to the present embodiment because the shielding electrodes 114 formed in the shielding region 132 are kept at the ground potential.

Second Embodiment

Figure 13:
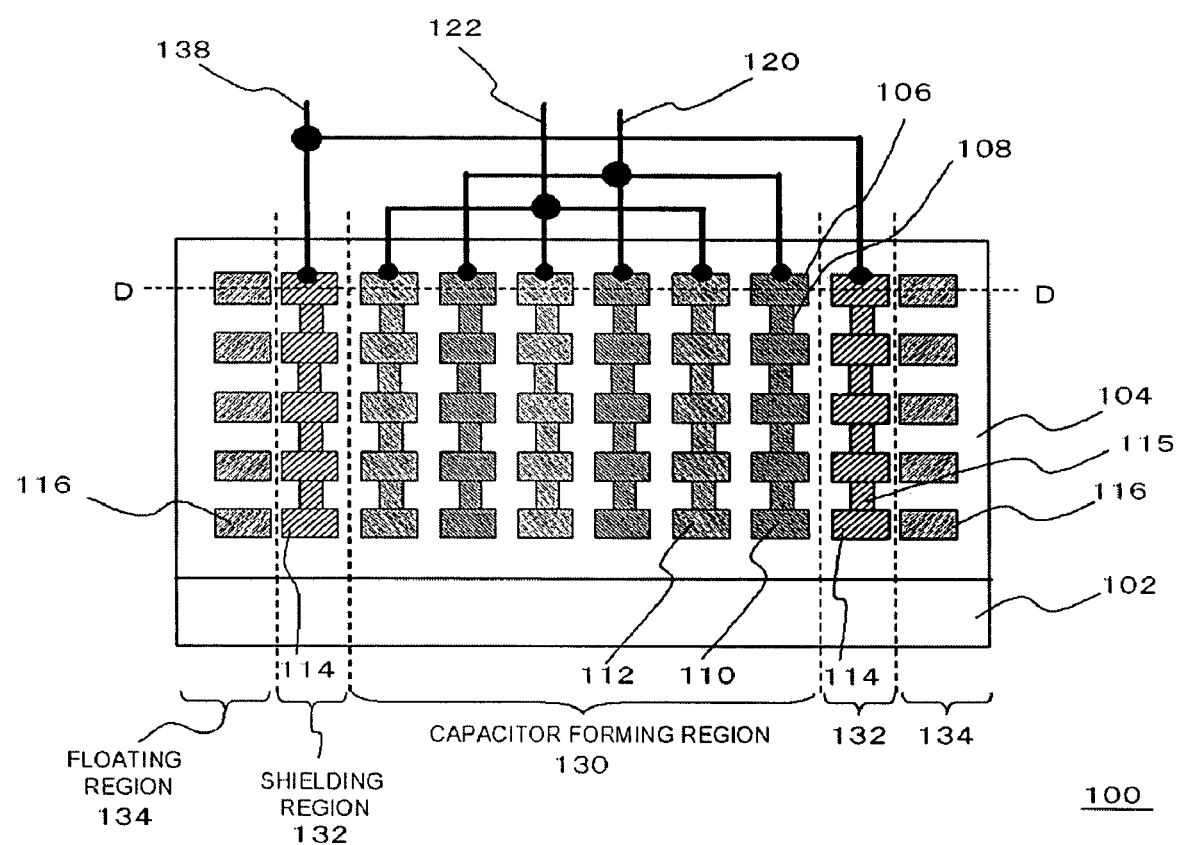
FIG. 13 is a cross-sectional view showing a configuration of a semiconductor device according to an embodiment of the present invention.

FIG. 13 is a cross-sectional view showing a configuration of a semiconductor device 100 according to the embodiment.

The present embodiment differs from the first embodiment in a point that shielding electrodes 114 are not connected to a semiconductor substrate 102. Other points are similar to those of the first embodiment which have been explained, and the explanation will not be repeated. In the present embodiment, the shielding electrodes 114 are connected to a third potential line 138, and the potential of the shielding electrodes 114 is set according to a potential at which the third potential line 138 is set.

Figure 14:
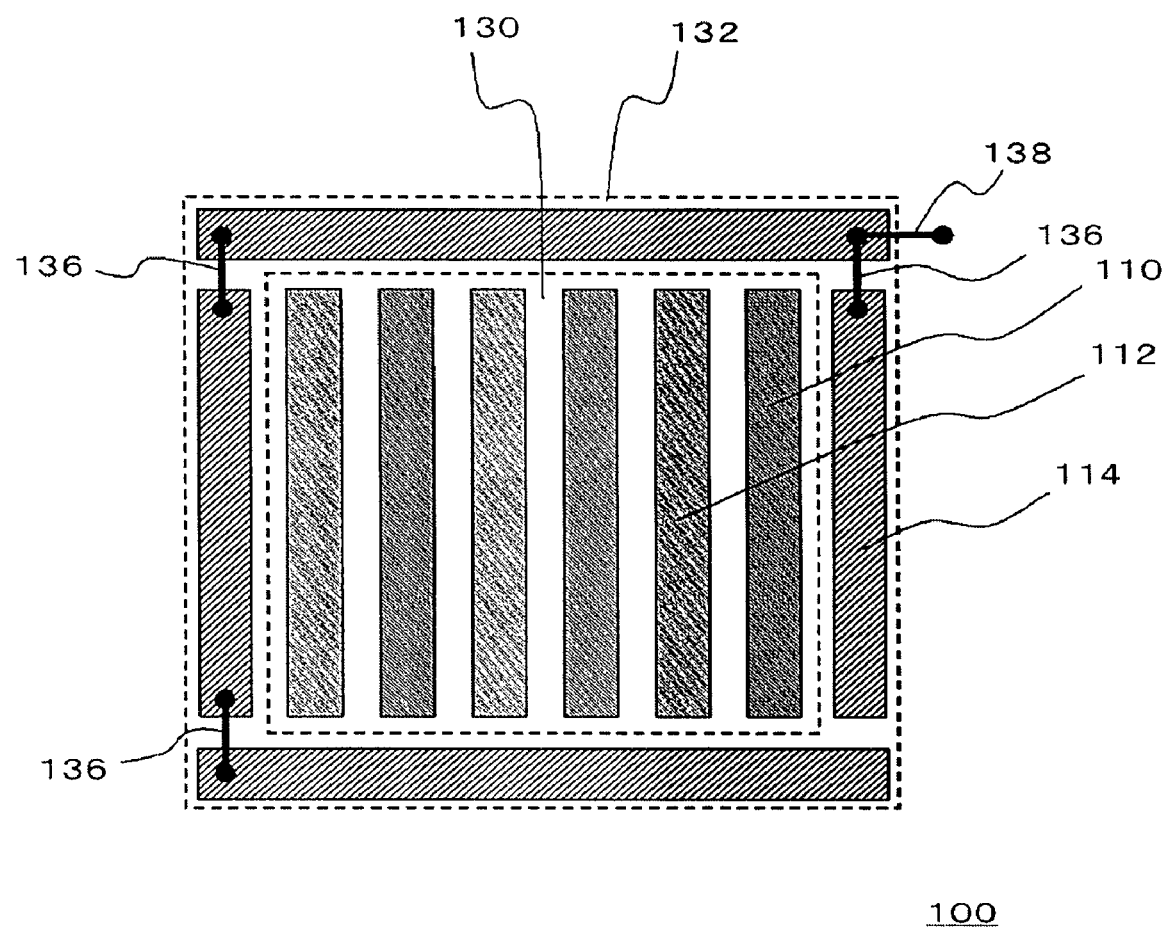
FIG. 14 is a cross-sectional plan view taken along the D-D line of the semiconductor device shown in FIG. 13.

FIG. 14 is a cross-sectional plan view taken along the D-D line of the semiconductor device 100 shown in FIG. 13.

Although the floating electrodes 116 are not shown in the drawing, the semiconductor device 100 may include the floating electrodes 116 in this embodiment as well. In the present embodiment, the shielding electrodes 114 may have a similar interconnection shape to that of a first electrode 110 and a second electrode 112 in at least one of a plurality of layers in which the shielding electrodes 114 are formed. Thereby, a pattern in which the first electrode 110 and the second electrode 112 are repeatedly arranged may be maintained and, at the same time, a plurality of the shielding electrodes 114 may be electrically connected in a simple configuration. In the present embodiment, the shielding electrodes 114 in other layers may be formed in a dot-like shape in a similar manner to that of FIG. 2.

In the present embodiment as well, a capacitor forming region 130 has a rectangular shape in the plan view, and a plurality of the shielding electrodes 114 are arranged around four sides of the capacitor forming region 130. In the present embodiment, any one of the plurality of shielding electrodes 114 may be set at a potential different from those of other shielding electrodes 114 by appropriately setting arrangement of the third potential line 138. Even in the above case, the shielding electrodes 114 arranged at the same side among the sides of the capacitor forming region 130 may be set at the same potential. Thereby, it may be secured that the capacitor forming region 130 is effectively shielded, using the shielding electrodes 114.

In the layer shown in FIG. 14, a plurality of shielding electrodes 114 are electrically connected to one another through connecting interconnections 136. Moreover, any one of the shielding electrodes 114 is connected to the third potential line 138. According to the above configuration, all the potentials of the plurality of shielding electrodes 114 can be set at the same one. The set potential of the third potential line 138 may be also set at the same potential as that of either of the first potential line 120 connected to the first electrode 110 or that of the second potential line 122 connected to the second electrode 112, or at an arbitrary potential between the potentials of the lines 120 and 122. For example, the third potential line 138 may be grounded, or may be set at an intermediate potential between the potential of the first potential line 120 and that of the second potential line 122.

Figure 15:
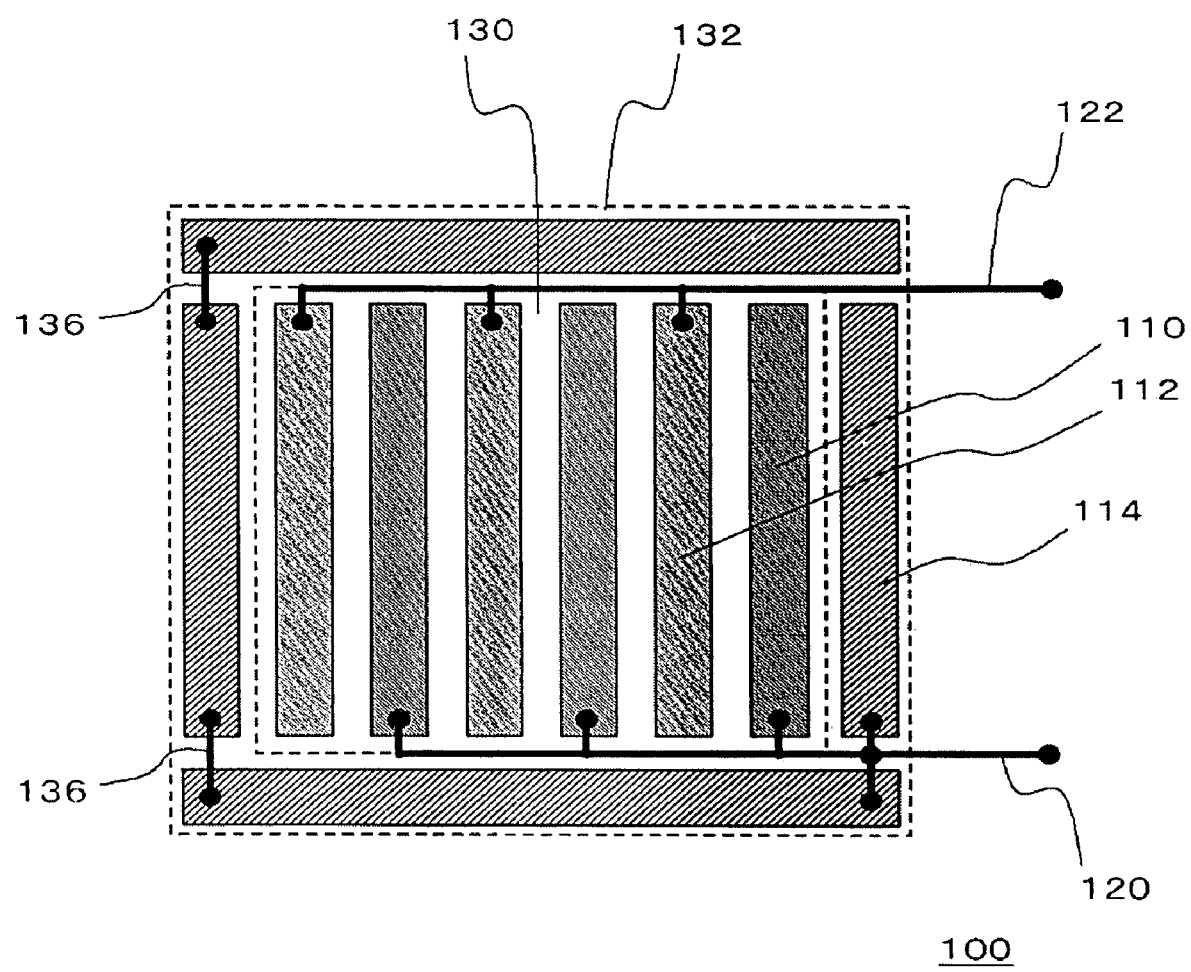
FIG. 15 is a view showing another example of the cross-sectional plan view taken along the D-D line of the semiconductor device shown in FIG. 13.

FIG. 15 is a view showing another example of the cross-sectional plan view taken along the D-D line of the semiconductor device 100 shown in FIG. 13.

In this drawing as well, the plurality of shielding electrodes 114 are electrically connected to one another through the connecting interconnection 136 in the similar manner to that of the configuration shown in FIG. 14. The present example differs from the configuration shown in FIG. 14 in a point that at least one of the shielding electrodes 114 is connected to the first potential line 120. According to the above configuration, the shielding electrodes 114 may be set at the same potential as that of the first electrode 110. Thereby, the capacitor forming region 130 may be cut off from other regions. Moreover, since the first potential line 120 is used for setting the potential of the shielding electrodes 114, the interconnection structure of the semiconductor device 100 may be simplified. Though the configuration in which the shielding electrode 114 is connected to the first potential line 120 is shown here, the shielding electrode 114 may be configured to be connected to the second potential line 122.

Figure 16:
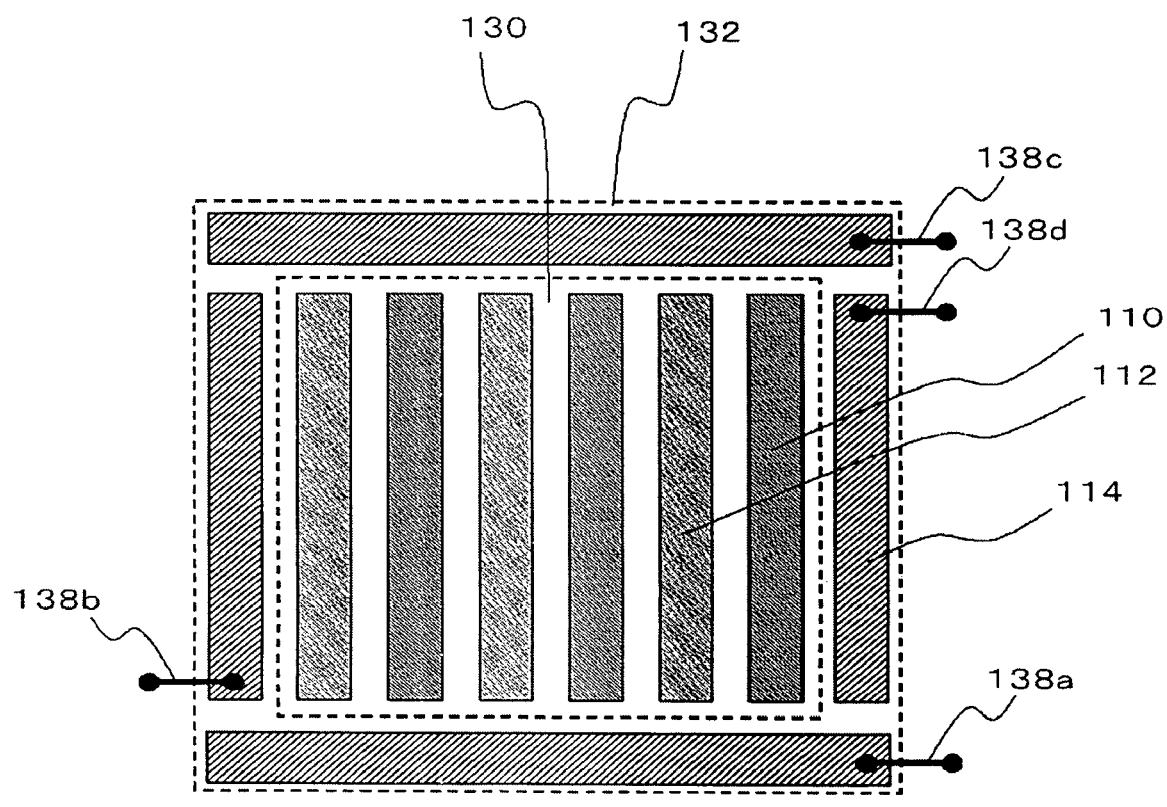
FIG. 16 is a view showing another example of the cross-sectional plan view taken along the D-D line of the semiconductor device shown in FIG. 13.

FIG. 16 is a view showing another example of the cross-sectional plan view taken along the D-D line of the semiconductor device 100 shown in FIG. 13.

Here, the third potential line 138 may be configured to include a plurality of potential lines 138a, 138b, 138c and 138d. The plurality of shielding electrodes 114 are connected to individual potential lines 138a through 138d.

The potential lines 138a through 138d may be set at individual potentials. For example, the potential of the potential line 138d connected to the shielding electrode 114 provided adjacent to the first electrode 110 may be set at the same potential as the potential set at the first electrode 110.

Similarly, the potential of the potential line 138b connected to the shielding electrode 114 provided adjacent to the second electrode 112 may be set at the same potential as the potential set at the second electrode 112. Moreover, the potential of the shielding electrode 114 which is extending in a direction nearly perpendicular to the extending direction of the first electrode 110 and the second electrode 112 may be set at, for example, an intermediate potential between the potential of the first electrode 110 and that of the second electrode 112, or may be set at the ground potential.

Thus, capacitance may be prevented from being generated between the capacitor forming region 130 and the shielding electrodes 114, because, by having the configuration in which the potentials of a plurality of the shielding electrodes 114 are set at individual values in the shielding region 132 formed around the capacitor forming region 130, the potential of the first electrode 110, or that of the second electrode 112 in the adjacent capacitor forming region 130 may be decided. Even by having the above configuration, the capacitor forming region 130 may be cut off from other regions because the shielding electrodes 114 set at a constant potential form a wall in each side of the capacitor forming region 130.

As described above, the same effect as that of the semiconductor device 100 according to the first embodiment can be obtained even in the semiconductor device 100 according to the present embodiment. Moreover, according to semiconductor device 100 of the present embodiment, the potentials of a plurality of the shielding electrodes 114 may be appropriately set, based on the potentials which are set in the first electrode 110 and the second electrode 112 in the capacitor forming region 130, arrangement of the shielding electrodes 114 with regard to the first electrode 110 and the second electrode 112, and the like.

Third Embodiment

Figure 17:
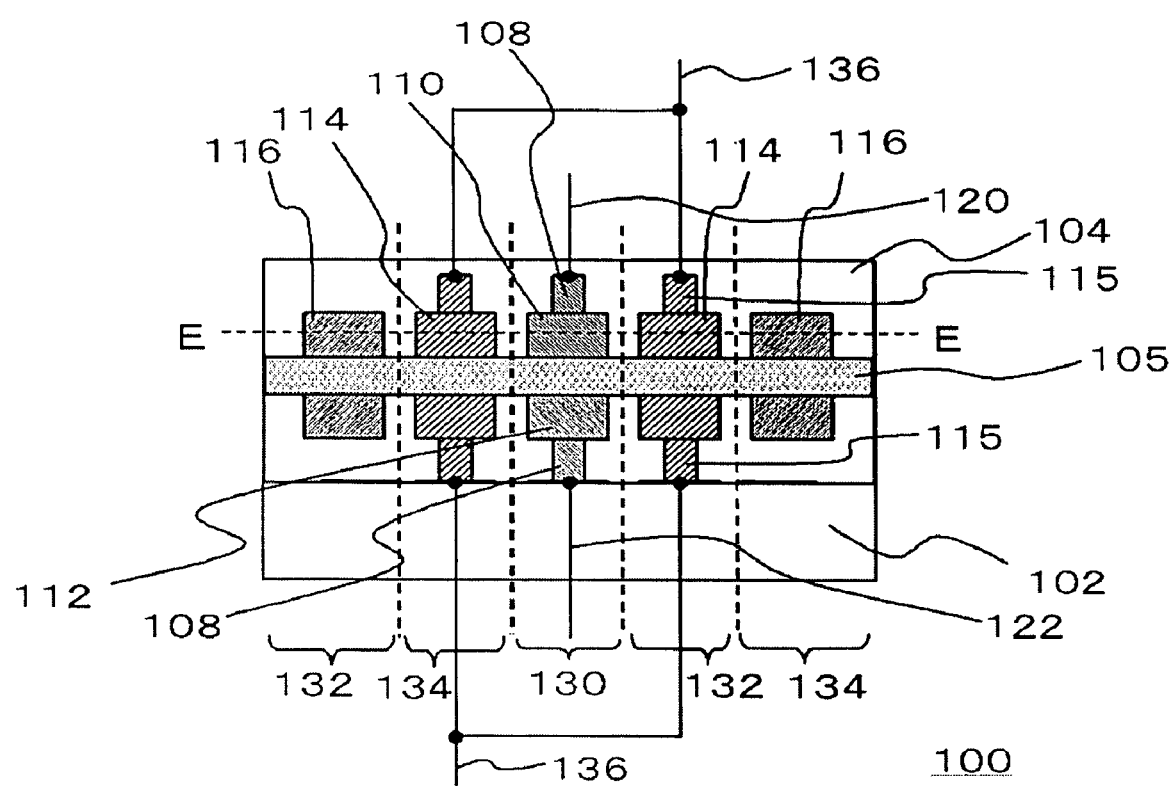
FIG. 17 is a cross-sectional view showing a configuration of a semiconductor device according to an embodiment of the present invention.

FIG. 17 is a cross-sectional view showing a configuration of a semiconductor device 100 according to an embodiment.

Although it is not shown, the semiconductor device 100 may include a logic region having a transistor formed in a region different from a capacitor forming region 130 on a semiconductor substrate 102, and a multilayer interconnection structure formed on the transistor in this embodiment as well. Interconnections and vias in the capacitor forming region 130, a shielding region 132, a floating region 134, and the like may be simultaneously formed with interconnections and vias in the multilayer interconnection structure of the logic region.

The present embodiment differs from the semiconductor device 100 according to the first and second embodiments in a point that a first electrode 110, an insulating interlayer 104, and a second electrode 112 are formed in different layers from one another.

The semiconductor device 100 according to the present embodiment has the semiconductor substrate 102, and the insulating interlayer 104 formed thereon. The insulating interlayer 104 is formed of a plurality of layers in a similar manner to that of the first embodiment. In the present embodiment, the insulating interlayer 104 may have a configuration including a capacitor film 105 formed of a material with a higher dielectric constant than that of insulating films used in other layers. Here, the second electrode 112 is formed under the layer, the first electrode 110 is formed on the layer at a distance from the second electrode 112, and the insulating interlayer 104 (capacitor film 105) exists between the second electrode 112 and the first electrode 110. Moreover, the second electrode 112 is connected to a semiconductor substrate 102 through a via 108, and is grounded through a second potential line 122. Moreover, the first electrode 110 is connected to a first potential line 120 set at a predetermined potential.

The semiconductor device 100 includes a plurality of electrode pairs of shielding electrodes 114, wherein the electrodes 114 pairs are provided in the same layer as that of the second electrode 112, or the first electrode 110. That is, the shielding electrode 114 is formed around the second electrode 112 in the layer in which the second electrode 112 is formed. Furthermore, a floating electrode 116 is formed around the electrode 114. Moreover, the shielding electrode 114 is formed around the first electrode 110 in the layer in which the first electrode 110 is formed. Furthermore, the floating electrode 116 is formed around the shielding electrode 114. The shielding electrode 114 formed in the same layer as that of the second electrode 112 is connected to the semiconductor substrate 102 through a shielding via 115, and is grounded through a connecting interconnection 136. Moreover, the shielding electrode 114 formed in the same layer as that of the first electrode 110 is set to be grounded potential through the shielding via 115 formed on the layer and a connecting interconnection 136.

In this embodiment as well, the shielding electrode 114 and the floating electrode 116 are simultaneously formed as the dummy pattern when the first electrode 110 and the second electrode 112 are formed. Thereby, the dimensional accuracy of the layer in which the first electrode 110 and the second electrode 112 are formed may be improved.

In semiconductor device 100 according to the present embodiment, for example, the second electrode 112, and the shielding electrode 114 and the floating electrode 116, which are formed in the same layer as that of the second electrode 112, are formed at the same time and at the same process as those of the interconnection for the multilayer interconnection structure of the logic region. A distance between the second electrode 112 and the first electrode 110 which is provided facing the second electrode 112 may be formed shorter than the distance between the upper and lower interconnections in the logic region, wherein an MIM capacitor is formed between the second electrode 112 and the first electrode 110. Accordingly, the via and the interconnection are formed only in the capacitor forming region 130, the shielding region 132, and the floating region 134. At this time, the capacitor film 105 may be formed on the second electrode 112, and the first electrode 110 may be formed thereon. Subsequently, the vias, the interconnections, the insulating films, and the like in the upper layer of the logic region may be formed at the same time and at the same process as those of the logic region, again.

Figure 18:
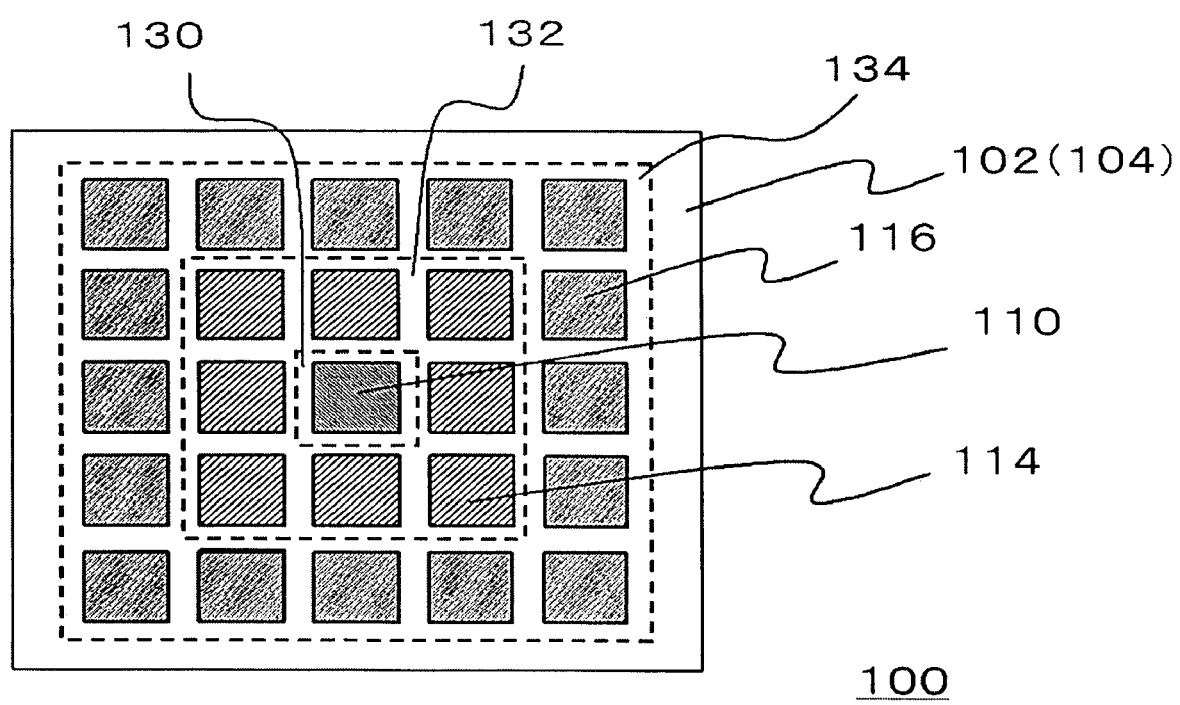
FIG. 18 is a cross-sectional plan view taken along the E-E line of the semiconductor device shown in FIG. 17.

FIG. 18 is a cross-sectional plan view taken along the E-E line of the semiconductor device 100 shown in FIG. 17.

In the present embodiment as well, the planar shape of the capacitor forming region 130 may be assumed to be a polygonal one, and a plurality of the shielding electrodes 114 are arranged in each side of the capacitor forming region 130. Moreover, the first electrode 110 (or the second electrode 112) has a dot-like planar shape. The shielding electrodes 114 also have a dot-like planar shape, and are distributed and arranged around four sides of the capacitor forming region 130 in which the first electrode 110 (or the second electrode 112) is formed. Furthermore, the floating electrodes 116 also have a dot-like planar shape, and are distributed and arranged around four sides of the capacitor forming region 132 in which the shielding electrode 114 is formed. According to the above configuration, the capacitor forming region 130 may be cut off from other regions by the shielding region 132. Moreover, each of the shielding electrodes 114 formed in the upper and lower layers is grounded, and capacitance may be prevented from being generated between the shielding electrodes 114. Though the example in which the shielding electrode is set at the ground potential has been shown here, the shielding electrode 114 may be at another potential, provided that the potentials of the shielding electrode 114 formed in the upper and lower layers are the same as each other.

Figure 19A:
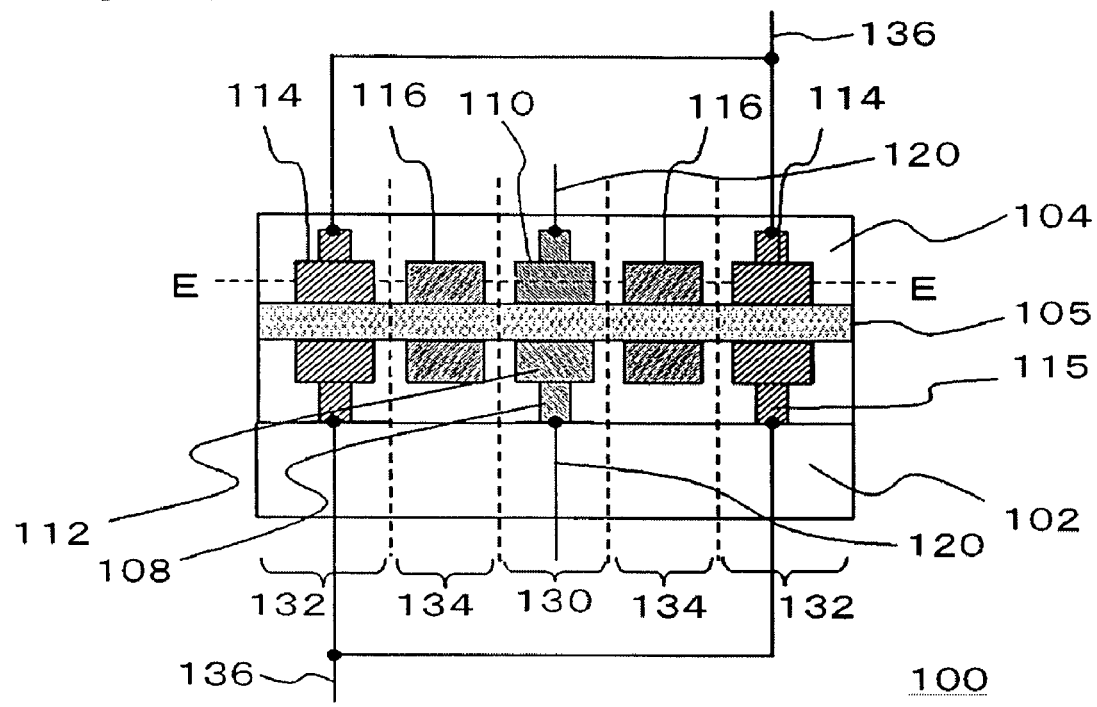
FIG. 19A is a view showing another example of the semiconductor device shown in FIG. 17.
Figure 19B:
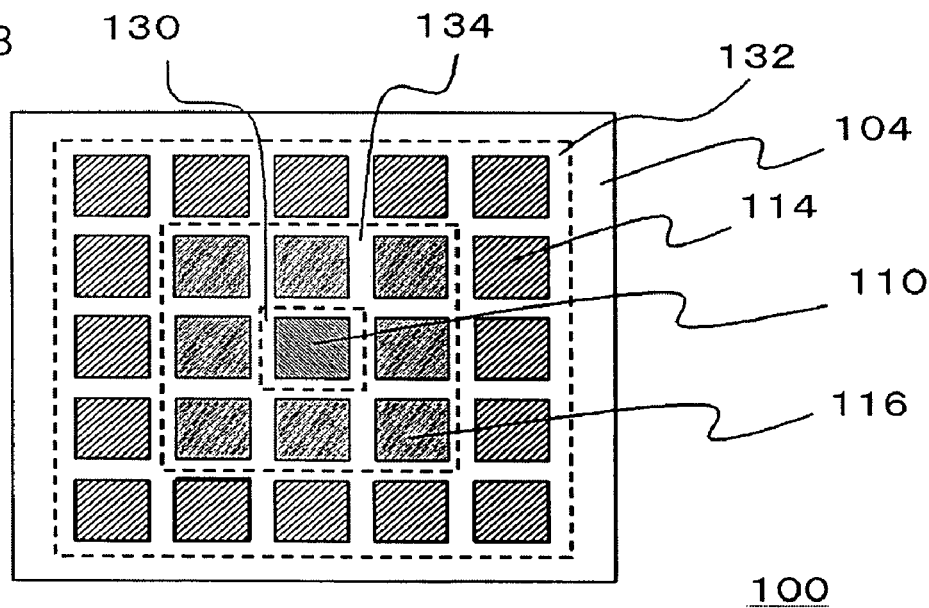
FIG. 19B is a view showing another example of the semiconductor device shown in FIG. 18.

FIGS. 19A and 19B are view showing another examples of the semiconductor device 100 shown in FIGS. 17 and 18.

Here, the floating region 134 is formed around the capacitor forming region 130, and, in addition, the shielding region 132 is formed around the floating region 134. According to the above configuration, the same effect as that of the semiconductor device 100 shown in FIG. 17 and FIG. 18. Moreover, in the present embodiment, the second electrode 112 is grounded, and the first electrode 110 is set at a high potential. When the shielding electrode 114 is arranged in the vicinity of the first electrode 110 set at the high potential, there is a possibility that capacitance is generated between the electrode 110 and the electrode 114, because the shielding electrode 114 is connected to the semiconductor substrate 102 and is grounded. Capacitance may be prevented from being generated between the first electrode 110 and the shielding electrode 114 in the example shown in FIGS. 19A and 19B, because the floating region 134 is provided between the capacitor forming region 130 and the shielding region 132, and a certain distance can be provided between the first electrode 110 set at the high potential and the shielding electrode 114.

Figure 20A:
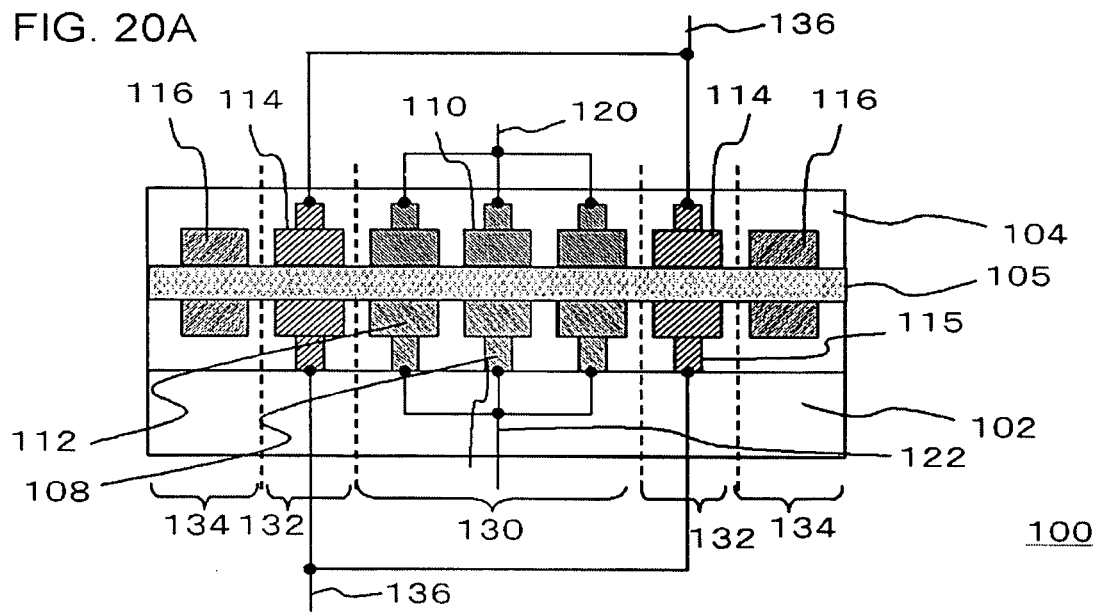
FIGS. 20A and 20B show another examples of the semiconductor device.
Figure 20B:
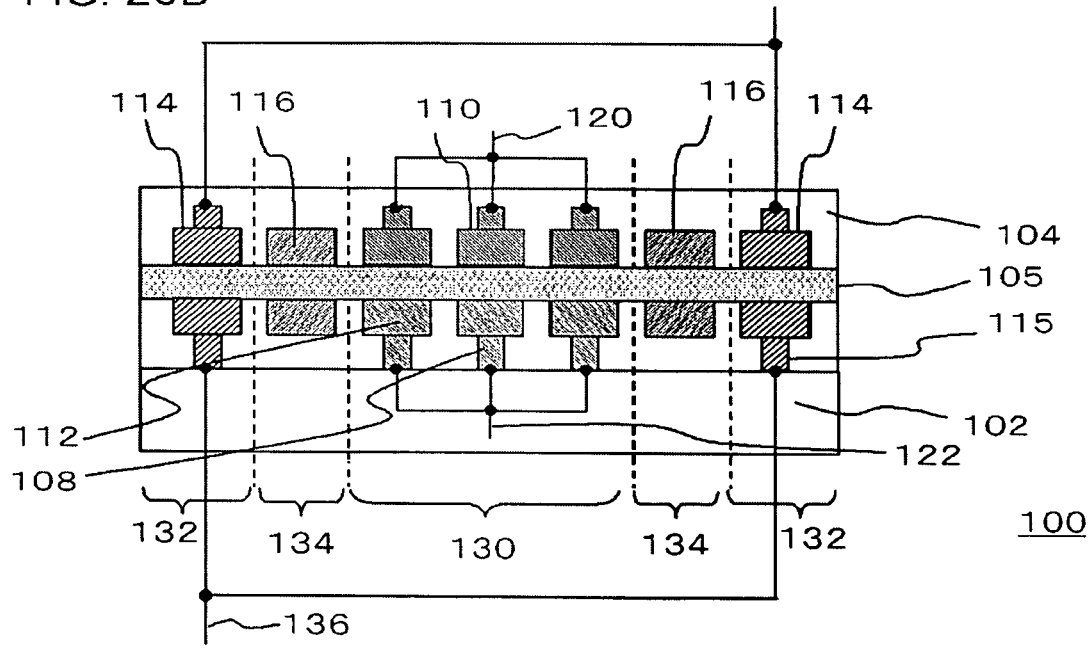

FIG. 20A and FIG. 20B are a cross-sectional view showing another example of the semiconductor device 100 according to the present embodiment.

FIG. 20A shows another example of the semiconductor device 100 shown in FIG. 17. FIG. 20B shows another example of the semiconductor device 100 shown in FIG. 19B. Though a configuration in which the capacitor forming region 130 including a pair of the first electrode 110 and the second electrode 112 is surrounded by the shielding region 132 has been shown in FIGS. 17, 18, 19A and 19B, the capacitor forming region 130 may have a configuration in which pairs of the first electrode 110 and the second electrode 112 are arranged side by side.

Moreover, even in the present embodiment, the first electrode 110 and the second electrode 112 may be configured to have an interconnection shape in which the electrodes are extending in one direction. Moreover, the shielding electrode 114 may also have a similar interconnection shape to that of the first electrode 110 and that of the second electrode 112. Furthermore, though the configuration in which the second electrode 112 is connected to the semiconductor substrate 102, and is grounded has been shown in the present embodiment, there may be adopted a configuration in which the second potential line 122 is set at a predetermined potential to set the potential of the second electrode 112. Even in the present embodiment, there may be adopted a configuration in which the shielding region 132 is formed in the upper and lower layers in the capacitor forming region 130.

Since the shielding electrode 114 and the floating electrode 116 are simultaneously formed as a dummy pattern when the first electrode 110 and the second electrode 112 are formed, the flatness of the layer may be maintained, and the dimensional accuracy of the semiconductor device 100 may be improved even according to the present embodiment, wherein an MIM capacitor is formed between the second electrode 112 and the first electrode 110. Moreover, the capacitor forming region 130 in which the MIM capacitor is formed may be shielded by the shielding electrodes 114 formed as described above, and the capacitance value of the MIM capacitor in the capacitor forming region 130 may be stabilized.

As described above, the present invention has been explained based on the embodiment. It will be appreciated by persons skilled in the art that the present embodiment is only illustrative and not restrictive, and various modifications may be made without departing from the spirit scope of the present invention.

Figure 21:
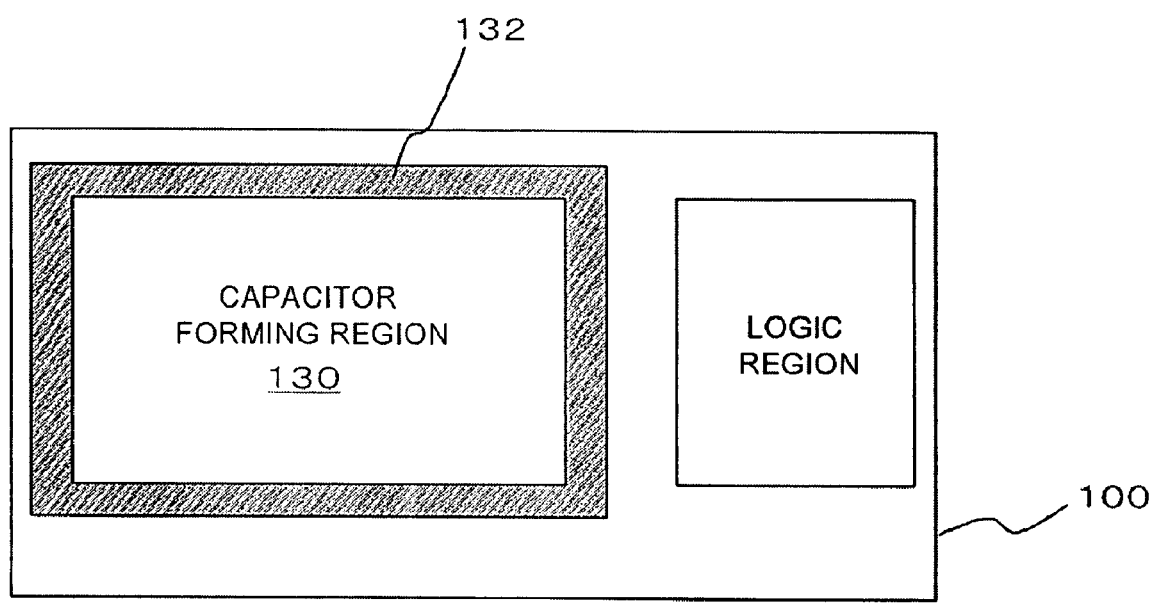
FIG. 21 is a top view showing an arrangement of a capacitor forming region, a shielding region, and a logic region in the semiconductor device.

FIG. 21 is a top view showing an arrangement of the capacitor forming region 130, the shielding region 132, and the logic region in the semiconductor device 100 which has been explained in the above-described embodiment. Thus, the capacitor forming region 130 may be shielded from other regions such as the logic region by the shielding electrodes 132 according to the semiconductor device 100 of the above embodiments, and the capacitance value of the MIM capacitor in the capacitor forming region 130 may be stabilized. Though only the logic region is illustrated here, the semiconductor device 100 according to the present invention may have a configuration in which the capacitor forming region 130 is shielded from various kinds of other regions.

Though various kinds of arranged patterns of the shielding electrode 114 in the shielding region 132 and the floating electrode 116 in the floating region 134 have been shown in the above-described embodiments, arrangements of the shielding electrode 114 and the floating electrode 116 not only the arranged pattern shown in the drawings, but also a variety of arranged patterns. There may be applied, for example, a configuration in which the shielding electrodes 114 in one line are formed in the outer edge of the capacitor forming region 130 in such a way that the region 130 is surrounded, and, at the same time, the shielding electrodes 114 in a plurality of lines are formed in a part of a region.

Though the floating electrode 116 is configured not to be connected through a via in the above-described embodiment, there may be adopted a configuration in which the electrode 116 is also connected through a via in the upper and lower layers.

Figure 22:
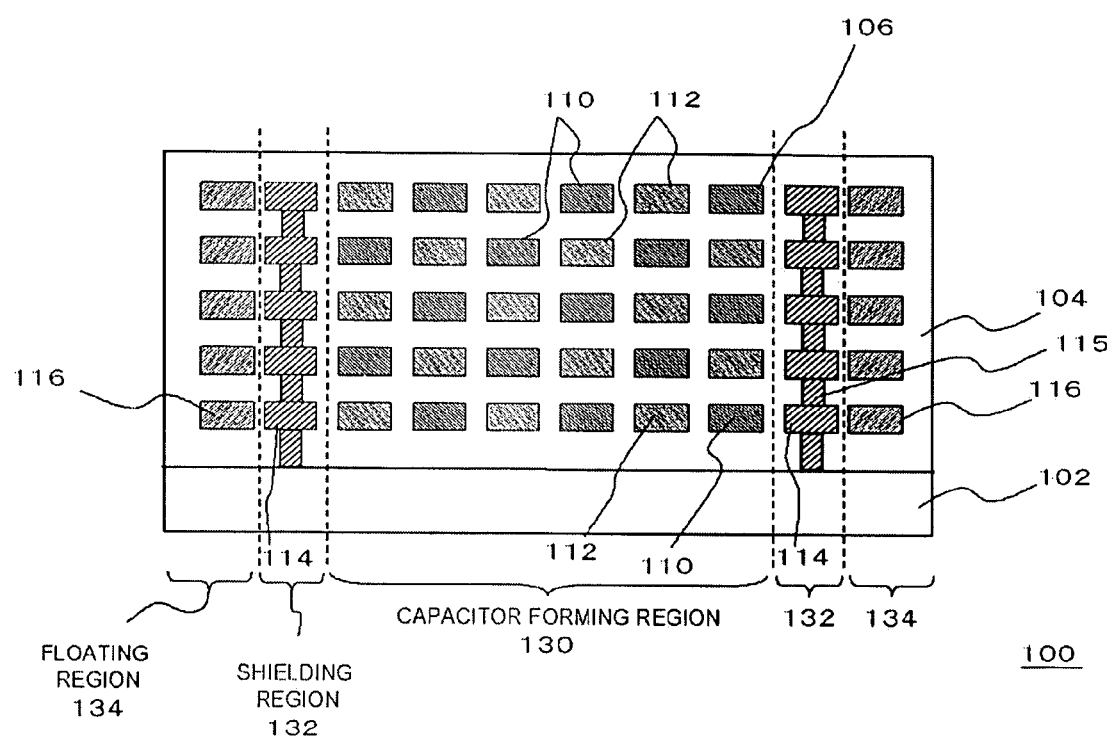
FIG. 22 is a cross-sectional view showing another example of the configurations of the semiconductor devices which have been explained in the embodiments according to the present invention.

Moreover, the arranged pattern for the first electrode 110 and the second electrode 112, which are formed in the capacitor forming region 130, is not limited to the patterns which have been shown in the drawings, but a variety of arranged patterns may be adopted in the semiconductor device 100 which has been explained in the first embodiment and the second embodiment. FIG. 22 is a cross-sectional view showing another example for the configurations of the semiconductor devices 100 which have been explained in the first and second embodiments. Here, the configuration of the present example is similar to the configurations which have been explained in the first embodiment and the second embodiment in a point that the first electrode 110 and the second electrode 112 are arranged in an alternating way in each layer. However, the configuration of the present example differs from the configurations, which have been explained in the first embodiment and the second embodiment, in a point that the first electrode 110 and the second electrode 112 are arranged in an alternating way even in the vertical direction. According to the above configuration, an MIM capacitor is formed even in the vertical direction, and the capacitance value of the MIM capacitor in the capacitor forming region 130 may be improved.

It is apparent that the present invention is not limited to the above embodiment, and may be modified and changed without departing from the scope and spirit of the invention.

What is claimed is:

1. A semiconductor device, comprising:
    a semiconductor substrate;
    a planar layer formed on said semiconductor substrate;
    a capacitor forming region, in said planar layer, comprising an MIM capacitor, said MIM capacitor comprising an insulating film formed on said semiconductor substrate, a first electrode, and a second electrode, said first electrode and said second electrode being arranged facing each other with said insulating film interposed therebetween; and
    a continuous shielding region in said planar layer and completely surrounding an outermost edge of said capacitor forming region and configured to shield said capacitor forming region from other regions outside said capacitor forming region, said shielding region comprising a plurality of shielding electrodes distributed throughout the shielding region along all sides of said outermost edge of said capacitor forming region,
    wherein an entirety of said capacitor forming region is within a shielded region defined by an area enclosed by said shielding region and a thickness equal to a thickness of said shielding region, and
    wherein a potential of each of said plurality of shielding electrodes is predetermined.

2. The semiconductor device according to claim 1, wherein, in said capacitor forming region, said first electrode, said insulating film, and said second electrode are arranged parallel to one another in the planar layer.

3. The semiconductor device according to claim 2, wherein, in said capacitor forming region, a plurality of said first electrodes and a plurality of said second electrodes are formed such that each of said plurality of first electrodes and each of said plurality of second electrodes are arranged through said insulating interlayer, parallel to each other, in an alternating way.

4. The semiconductor device according to claim 2, wherein said planar layer further comprises a multilayer interconnection structure provided with a plurality of interconnection layers,
    wherein, in said capacitor forming region, a plurality of said first electrodes and a plurality of said second electrodes are formed such that both of said first electrodes and said second electrodes are arranged in each of said plurality of interconnection layers, and
    wherein said shielding region is formed along an outermost edge of said plurality of first electrodes and said plurality of second electrodes in each of said plurality of interconnection layers,
    wherein portions of said plurality of shielding electrodes are arranged to occupy each of said plurality of interconnection layers, and
    wherein each portion of said plurality of shielding electrodes occupying one of said plurality of interconnection layers is connected to another portion of said plurality of shielding electrodes occupying another of said plurality of interconnection layers by means of a plurality of vias.

5. The semiconductor device according to claim 2, further comprising:
    a logic region formed in the planar layer and distinct from said capacitor forming region and including a transistor and a multilayer interconnection structure formed on said transistor.

6. The semiconductor device according to claim 1,
    wherein said planar layer comprises a planar first sub-layer and a planar second sub-layer beneath said first sub-layer,
    wherein said plurality of shielding electrodes comprises a first shielding electrodes and a second shielding electrodes, and
    wherein said first electrode of said MIM capacitor and the first shielding electrodes are formed in the first sub-layer, and said second electrode of said MIM capacitor and the second shielding electrodes are formed in the second sub-layer.

7. The semiconductor device according to claim 6, wherein said shielding region further includes a plurality of vias connecting said first shielding electrodes with said second shielding electrodes.

8. The semiconductor device according to claim 6, wherein each of said first shielding electrodes and each of said second shielding electrodes have a same predetermined potential.

9. The semiconductor device according to claim 1, further comprising:
    a floating region, including a plurality of floating electrodes, formed between one of i) said shielding region and said capacitor forming region and ii) said shielding region and said other regions on said semiconductor substrate in the planar layer.

10. The semiconductor device according to claim 9, wherein each of said plurality of floating electrodes has a shape same as a shape of said shielding electrode in two-dimensional arrangement.

11. The semiconductor device according to claim 1,
    wherein said capacitor forming region has a polygonal shape in two-dimensional arrangement,
    wherein said plurality of shielding electrodes of said shielded region are arranged along each of the sides of said polygonal shape of said capacitor forming region, and
    wherein at least a portion of said shielding electrodes at one of the sides of said polygonal shape of said capacitor forming region have a same predetermined potential.

12. The semiconductor device according to claim 1,
    wherein each of said plurality of shielding electrodes has a dot-like shape, and
    wherein said plurality of shielding electrodes are arranged to be distributed in two-dimensional arrangement in said shielding region.

13. The semiconductor device according to claim 1, wherein a shape of each of said plurality of shielding electrodes is same as one of first a shape of said first electrode and a second shape of said second electrode.

14. The semiconductor device according to claim 1, wherein said shielding region further includes another plurality of shielding electrodes arranged to cover at least one of an upper and a lower surfaces of said MIM capacitor.

15. The semiconductor device according to claim 1, wherein at least a first of said shielding electrodes has a predetermined potential different from a second of said shielding electrodes.

16. The semiconductor device according to claim 1, wherein all of said plurality of shielding electrodes have a same predetermined potential.

17. The semiconductor device according to claim 1, wherein at least one of said plurality of shielding electrodes has a same predetermined potential as a predetermined potential of one of said first electrode and said second electrode.

18. The semiconductor device according to claim 1, wherein at least one of said plurality of shielding electrodes is electrically connected to one of said first electrode and said second electrode.

19. The semiconductor device according to claim 1, wherein at least one of said plurality of shielding electrodes is grounded.

20. The semiconductor device according to claim 1, wherein a shape of each of said plurality of shielding electrodes is smaller than one of a shape of said first electrode and a shape of said second electrode.

* * * * *

UNITED STATES PATENT AND TRADEMARK OFFICE
CERTIFICATE OF CORRECTION

| | | |
|---|---|---|
| PATENT NO. | : 7,663,207 B2 | Page 1 of 1 |
| APPLICATION NO. | : 11/407323 | |
| DATED | : February 16, 2010 | |
| INVENTOR(S) | : Kikuta et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 774 days.

Signed and Sealed this

Twenty-eighth Day of December, 2010

David J. Kappos
*Director of the United States Patent and Trademark Office*